United States Patent
Measor et al.

(10) Patent No.: US 10,928,740 B2
(45) Date of Patent: Feb. 23, 2021

(54) THREE-DIMENSIONAL CALIBRATION STRUCTURES AND METHODS FOR MEASURING BURIED DEFECTS ON A THREE-DIMENSIONAL SEMICONDUCTOR WAFER

(71) Applicant: KLA-Tencor Corporation, Milpitas, CA (US)

(72) Inventors: Philip Measor, San Jose, CA (US); Robert M. Danen, San Jose, CA (US)

(73) Assignee: KLA Corporation, Milpitas, CA (US)

( * ) Notice: Subject to any disclaimer, the term of this patent is extended or adjusted under 35 U.S.C. 154(b) by 319 days.

(21) Appl. No.: 15/830,232

(22) Filed: Dec. 4, 2017

(65) Prior Publication Data

US 2018/0224749 A1    Aug. 9, 2018

Related U.S. Application Data

(60) Provisional application No. 62/587,298, filed on Nov. 16, 2017, provisional application No. 62/454,645, filed on Feb. 3, 2017.

(51) Int. Cl.
  *G03F 7/20* (2006.01)
  *G03F 7/00* (2006.01)
  (Continued)

(52) U.S. Cl.
  CPC .......... *G03F 7/7065* (2013.01); *G01N 21/93* (2013.01); *G01N 21/9501* (2013.01);
  (Continued)

(58) Field of Classification Search
  CPC .............. G01N 21/93; G01N 21/9501; G01N 21/9503; G01N 21/95607;
  (Continued)

(56) References Cited

U.S. PATENT DOCUMENTS 5,173,441 A    12/1992  Yu et al.
6,433,561 B1    8/2002  Satya et al.
(Continued)

OTHER PUBLICATIONS

W.C. Oliver and G.M. Pharr, An improved technique for determining hardness and elastic modulus using load and displacement sensing indentation experiments, J. Materials Research, vol. 7, No. 6, pp. 1564-1583, Jun. 1992.
(Continued)

*Primary Examiner* — Hina F Ayub
(74) *Attorney, Agent, or Firm* — Suiter Swantz pc llo

(57) ABSTRACT

A three-dimensional calibration structure for measuring buried defects on a semiconductor device is disclosed. The three-dimensional calibration structure includes a defect standard wafer (DSW) including one or more programmed surface defects. The three-dimensional calibration structure includes a planarized layer deposited on the DSW. The three-dimensional calibration structure includes a layer stack deposited on the planarized layer. The layer stack includes two or more alternating layers. The three-dimensional calibration structure includes a cap layer deposited on the layer stack. One or more air gaps are formed in the layer stack following deposition of the cap layer. The three-dimensional calibration structure includes one or more holes formed into at least one of the cap layer, the layer stack, or the planarized layer.

30 Claims, 16 Drawing Sheets

(51) Int. Cl.
*G03F 1/84* (2012.01)
*H01J 37/28* (2006.01)
*G01N 21/95* (2006.01)
*H01L 21/67* (2006.01)
*H01L 21/66* (2006.01)
*G01N 21/93* (2006.01)
*G01N 21/956* (2006.01)

(52) U.S. Cl.
CPC ... *G01N 21/9503* (2013.01); *G01N 21/95607* (2013.01); *G03F 1/84* (2013.01); *G03F 7/0037* (2013.01); *H01J 37/28* (2013.01); *H01L 22/12* (2013.01); *H01L 22/26* (2013.01); *H01J 2237/2817* (2013.01); *H01L 21/67288* (2013.01)

(58) Field of Classification Search
CPC ... H01L 21/67288; H01L 22/12; H01L 22/26; H01J 2237/2817; H01J 37/28; G03F 1/84; G03F 7/0037; G03F 7/7065
See application file for complete search history.

(56) References Cited

U.S. PATENT DOCUMENTS

| | | |
|---|---|---|
| 7,132,684 B2 | 11/2006 | Lee |
| 7,576,317 B1 | 8/2009 | Tortonese et al. |
| 7,863,106 B2 | 1/2011 | Christo et al. |
| 8,623,673 B1 | 1/2014 | Dyer et al. |
| 9,318,395 B2 | 4/2016 | Campochiaro et al. |
| 2009/0242759 A1* | 10/2009 | Bray .................. G01R 31/307 250/307 |
| 2013/0299699 A1 | 11/2013 | Nakayama et al. |
| 2013/0343632 A1 | 12/2013 | Urano et al. |
| 2014/0300890 A1 | 10/2014 | Lange et al. |
| 2014/0340682 A1 | 11/2014 | Kwak et al. |
| 2016/0069929 A1* | 3/2016 | Gauzner ............... G01Q 40/00 428/195.1 |
| 2018/0088056 A1* | 3/2018 | Shortt .................. G01N 1/286 |
| 2018/0103247 A1* | 4/2018 | Kolchin ............ G01N 21/9505 |

OTHER PUBLICATIONS

International Search Report dated May 15, 2018 for PCT/US2018/016758.

* cited by examiner

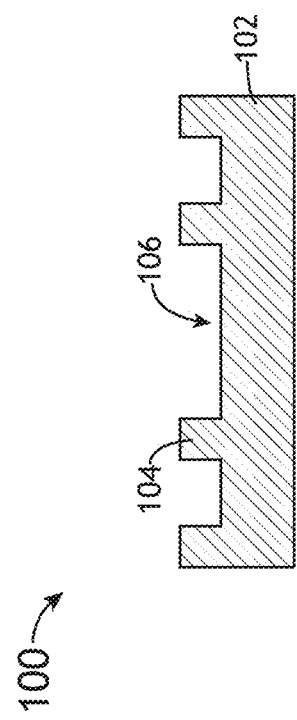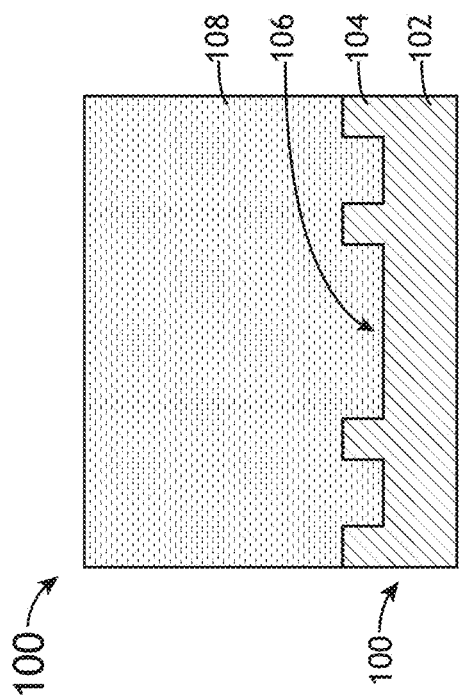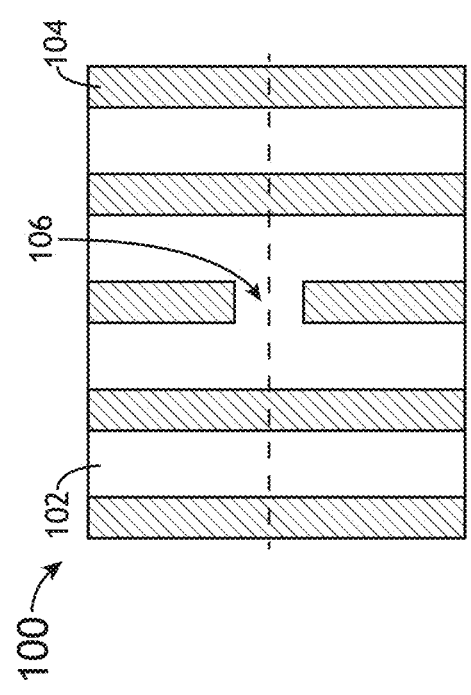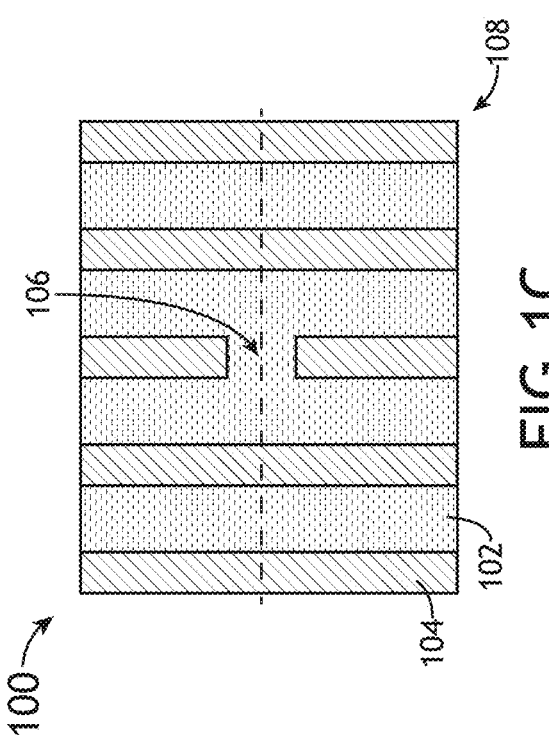

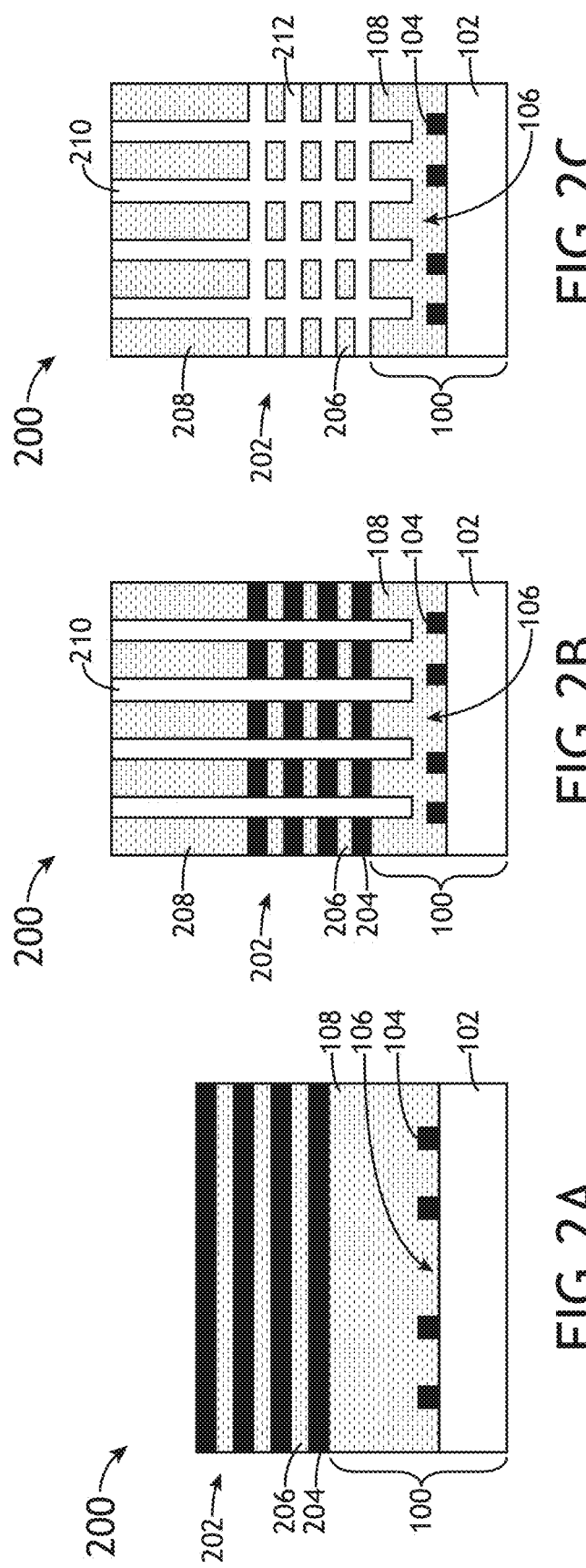

THREE-DIMENSIONAL CALIBRATION STRUCTURES AND METHODS FOR MEASURING BURIED DEFECTS ON A THREE-DIMENSIONAL SEMICONDUCTOR WAFER

CROSS-REFERENCE TO RELATED APPLICATIONS

The present application claims the benefit under 35 U.S.C. § 119(e) of U.S. Provisional Patent Application Ser. No. 62/454,645, filed Feb. 3, 2017, titled TEST STRUCTURES AND METHODS TO MEASURE BURIED DEFECTS FOR THREE-DIMENSIONAL SEMICONDUCTOR WAFER INSPECTION, naming Philip Measor and Robert M. Danen as inventors; and U.S. Provisional Patent Application Ser. No. 62/587,298, filed Nov. 16, 2017, titled THREE-DIMENSIONAL CALIBRATION STRUCTURES AND METHODS FOR MEASURING BURIED DEFECTS ON A THREE-DIMENSIONAL SEMICONDUCTOR WAFER, naming Philip Measor and Robert M. Danen as inventors, which are incorporated herein by reference in the entirety.

TECHNICAL FIELD

The present invention generally relates to semiconductor wafer fabrication and metrology and, more particularly, to three-dimensional calibration structures and methods for measuring buried defects on a three-dimensional semiconductor wafer.

BACKGROUND

The fabrication of semiconductor devices, such as logic and memory devices, typically includes processing a semiconductor device using a large number of semiconductor fabrication and metrology processes to form various features and multiple layers of the semiconductor devices. Some fabrication processes utilize photomasks/reticles to print features on a semiconductor device such as a wafer. As semiconductor devices become smaller and smaller laterally and extended vertically, it becomes critical to develop enhanced inspection and review devices and procedures to increase the resolution, speed, and throughput of wafer and photomask/reticle inspection processes.

One type of semiconductor device involves 3D NAND technology, where layers of data storage cells are stacked vertically. As the number of layers and storage elements increases in the 3D NAND semiconductor device, optical inspection or electrical inspection variables including, but not limited to, depth of field, spherical aberration, chromatic aberration, coherence, landing energy, beam current, z-stage hysteresis, or the like may be impacted, resulting in a need for calibration of a characterization tool.

One process of calibrating characterization tools for 3D NAND semiconductor devices involves taking measurements of defect standard wafers (DSW) with one or more programmed surface defects to demonstrate and establish baseline measurements for the characterization tools. Calibration performed by taking measurements of programmed surface defects limits the ability to test and determine detection sensitivity and limits of the characterization tools for post-installation qualification for the 3D NAND semiconductor devices. For example, obtaining measurements of programmed surface defects may result in calibration where one or more parameters such as, but not limited to, material type, refractive indexes, structure dimensions, defect locations, defect structure type, or the like are unknown. As a result, a test to verify a buried defect at a specific location may be inconclusive, which may lead to increased research and development time, as well as prevent conclusive characterization tool demonstrations. Calibration performed by taking measurements of programmed surface defects additionally limits the design process for next-generation characterization tools.

Therefore, it would be desirable to provide a calibration structure, and corresponding systems and methods to utilize the calibration structure, that cures the shortcomings as described above.

SUMMARY

A system is disclosed, in accordance with one or more embodiments of the present disclosure. In one embodiment, the system includes a controller. In another embodiment, the controller includes one or more processors configured to receive one or more measurements from a characterization tool. In another embodiment, the controller includes memory configured to store a set of program instructions. In another embodiment, the one or more processors are configured to execute the set of program instructions. In another embodiment, the set of program instructions are configured to cause the one or more processors to receive one or more measurements of the three-dimensional calibration structure. In another embodiment, the set of program instructions are configured to cause the one or more processors to receive one or more measurements of the sample. In another embodiment, the set of program instructions are configured to cause the one or more processors to correct the received one or more measurements of the sample based on the received one or more measurements of the three-dimensional calibration structure.

A system is disclosed, in accordance with one or more embodiments of the present disclosure. In one embodiment, the system includes a characterization tool. In another embodiment, the characterization tool is configured to acquire one or more measurements of a three-dimensional calibration structure. In another embodiment, the characterization tool is configured to acquire one or more measurements of a sample. In another embodiment, the system includes a controller. In another embodiment, the controller includes one or more processors configured to receive one or more measurements from a characterization tool. In another embodiment, the controller includes memory configured to store a set of program instructions. In another embodiment, the one or more processors are configured to execute the set of program instructions. In another embodiment, the set of program instructions are configured to cause the one or more processors to receive the one or more measurements of the three-dimensional calibration structure. In another embodiment, the set of program instructions are configured to cause the one or more processors to receive the one or more measurements of the sample. In another embodiment, the set of program instructions are configured to cause the one or more processors to correct the received one or more measurements of the sample based on the received one or more measurements of the three-dimensional calibration structure.

A method is disclosed, in accordance with one or more embodiments of the present disclosure. In one embodiment, the method may include, but is not limited to, receiving one or more measurements of a three-dimensional calibration structure from a characterization tool. In another embodiment, the three-dimensional calibration structure includes a defect standard wafer (DSW) including one or more programmed surface defects. In another embodiment, the three-dimensional calibration structure includes a planarized layer deposited on the DSW. In another embodiment, the three-dimensional calibration structure includes a layer stack deposited on the planarized layer. In another embodiment, the layer stack includes two or more alternating layers. In another embodiment, the three-dimensional calibration structure includes a cap layer deposited on the layer stack. In another embodiment, one or more air gaps are formed in the layer stack following deposition of the cap layer. In another embodiment, the three-dimensional calibration structure includes one or more holes patterned and etched into at least one of the cap layer, the layer stack, or the planarized layer. In another embodiment, the method may include, but is not limited to, receiving one or more measurements of a sample from the characterization tool. In another embodiment, the method may include, but is not limited to, correcting the received one or more measurements of the sample based on the received one or more measurements of the three-dimensional calibration structure.

A three-dimensional calibration structure for measuring buried defects on a three-dimensional semiconductor device is disclosed, in accordance with one or more embodiments of the present disclosure. In one embodiment, the three-dimensional calibration structure includes a defect standard wafer (DSW) including one or more programmed surface defects. In another embodiment, the three-dimensional calibration structure includes a planarized layer deposited on the DSW. In another embodiment, the three-dimensional calibration structure includes a layer stack deposited on the planarized layer. In another embodiment, the layer stack includes two or more alternating layers. In another embodiment, the three-dimensional calibration structure includes a cap layer deposited on the layer stack. In another embodiment, one or more air gaps are formed in the layer stack following deposition of the cap layer. In another embodiment, the three-dimensional calibration structure includes one or more holes patterned and etched into at least one of the cap layer, the layer stack, or the planarized layer.

A system is disclosed, in accordance with one or more embodiments of the present disclosure. In one embodiment, the system includes one or more deposition tools configured to deposit one or more layers on a defect standard wafer (DSW). In another embodiment, the DSW includes one or more programmed surface defects. In another embodiment, the system includes one or more patterning tools configured to provide a pattern to the one or more layers deposited on the wafer. In another embodiment, the system includes one or more etching tools configured to etch the one or more patterned layers deposited on the wafer.

A method is disclosed, in accordance with one or more embodiments of the present disclosure. In one embodiment, the method may include, but is not limited to, depositing a planarized layer on a defect standard wafer (DSW) including one or more programmed surface defects. In another embodiment, the method may include, but is not limited to, depositing a layer stack on the planarized layer. In another embodiment, the layer stack includes two or more alternating layers. In another embodiment, the method may include, but is not limited to, depositing a cap layer on the layer stack. In another embodiment, the method may include, but is not limited to, forming one or more holes into at least one of the cap layer, the layer stack, or the planarized layer. In another embodiment, the method may include, but is not limited to, forming one or more air gaps into the layer stack.

BRIEF DESCRIPTION OF THE DRAWINGS

The numerous advantages of the disclosure may be better understood by those skilled in the art by reference to the accompanying figures in which:

FIG. 1A illustrates a simplified top view of a defect standard wafer (DSW) including one or more programmed surface defects, in accordance with one or more embodiments of the present disclosure;

FIG. 1B illustrates a simplified cross-section view of a DSW including one or more programmed surface defects, in accordance with one or more embodiments of the present disclosure;

FIG. 1C illustrates a simplified top view of a DSW including one or more buried defects, in accordance with one or more embodiments of the present disclosure;

FIG. 1D illustrates a simplified cross-section view of a DSW including one or more buried defects, in accordance with one or more embodiments of the present disclosure;

FIG. 2A illustrates a simplified cross-section view of a three-dimensional calibration structure for measuring buried defects of a three-dimensional semiconductor device, in accordance with one or more embodiments of the present disclosure;

FIG. 2B illustrates a simplified cross-section view of a three-dimensional calibration structure for measuring buried defects of a three-dimensional semiconductor device, in accordance with one or more embodiments of the present disclosure;

FIG. 2C illustrates a simplified cross-section view of a three-dimensional calibration structure for measuring buried defects of a three-dimensional semiconductor device, in accordance with one or more embodiments of the present disclosure;

DETAILED DESCRIPTION OF THE INVENTION

Figure 3:
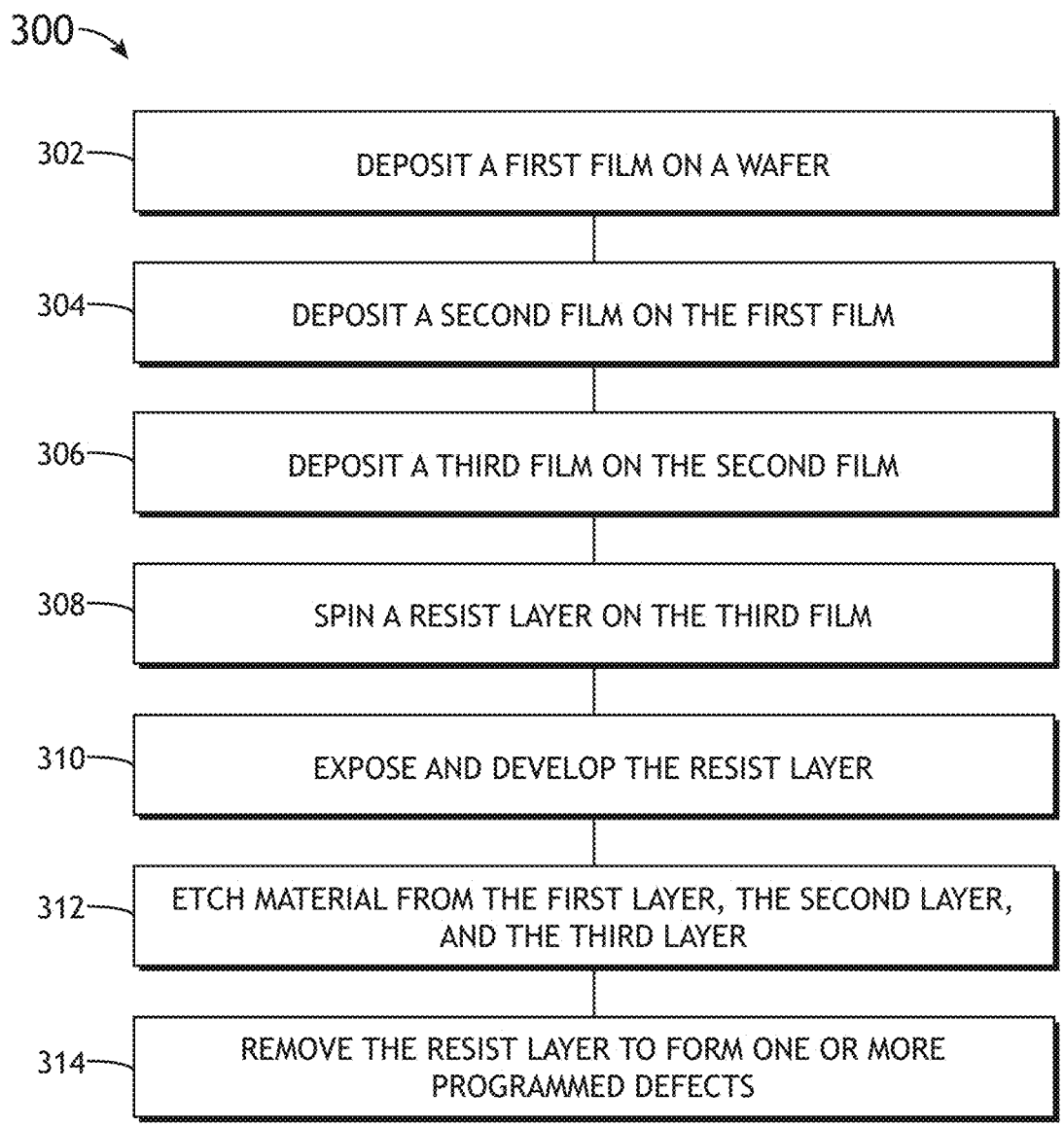
FIG. 3 illustrates a process flow diagram depicting a film/coating deposition process to fabricate a DSW, in accordance with one or more embodiments of the present disclosure.

Reference will now be made in detail to the subject matter disclosed, which is illustrated in the accompanying drawings.

Referring generally to FIGS. 1A-14, three-dimensional calibration structures and methods for measuring buried defects on a three-dimensional semiconductor wafer are described, in accordance with one or more embodiments of the present disclosure.

Embodiments of the present disclosure are directed to a three-dimensional defect standard wafer (DSW) calibration structure including programmed buried defects to calibrate, demonstrate, and/or establish baselines for buried defect detection or characterization of three-dimensional semiconductor devices (e.g., 3D NAND semiconductor devices). Embodiments of the present disclosure are also directed to a method of fabricating the three-dimensional DSW calibration structure including programmed buried defects to calibrate, demonstrate, and/or establish baselines for buried defect detection or characterization of three-dimensional semiconductor devices. Embodiments of the present disclosure are also directed to a system for fabricating the three-dimensional DSW calibration structure including programmed buried defects to calibrate, demonstrate, and/or establish baselines for buried defect detection or characterization of three-dimensional semiconductor devices.

Embodiments of the present disclosure are also directed to a method for calibrating a characterization tool with the three-dimensional DSW calibration structure including programmed buried defects to calibrate, demonstrate, and/or establish baselines for buried defect detection or inspection of three-dimensional semiconductor devices. Embodiments of the present disclosure are also directed to a system for calibrating the characterization tool with the three-dimensional DSW calibration structure including programmed buried defects to calibrate, demonstrate, and/or establish baselines for buried defect detection or inspection of three-dimensional semiconductor devices.

FIGS. 1A and 1B generally illustrate a defect standard wafer (DSW) 100 with programmed surface defects, in accordance with one or more embodiments of the present disclosure. It is noted herein that FIG. 1A represents a top view of the DSW 100, while FIG. 1B represents a cross-section view of the DSW 100 at the dotted line illustrated in FIG. 1A.

In one embodiment, the DSW 100 includes a wafer 102. Many different types of devices may be formed on the wafer 102, and the term wafer as used herein is intended to encompass a wafer on which any type of device known in the art is being fabricated.

In another embodiment, one or more polygons 104 are located on a surface of the wafer 102. In another embodiment, the one or more polygons 104 include one or more programmed surface defects 106. For example, a programmed defect 106 may be a programmed as an open line defect. Semiconductor devices with programmed surface defects for performing specific tests of physical or system limitations of semiconductor device characterization tools are generally described in U.S. Pat. No. 6,433,561, issued on Aug. 13, 2002; U.S. Pat. No. 7,132,684, issued on Nov. 7, 2006; U.S. Pat. No. 7,863,106, issued on Jan. 4, 2011; and U.S. Pat. No. 8,623,673, issued on Jan. 7, 2014, which are incorporated herein by reference in the entirety.

The one or more programmed surface defects 106 may include any semiconductor device defect known in the art. For example, the one or more programmed surface defects 106 may include, but are not limited to, material added or absent as a result of a fabrication process. For instance, the one or more programmed surface defects 106 may include, but are not limited to, one or more line-open defects, one or more protrusion defects, one or more bridge defects, or one or more thin-line defects. By way of another example, the one or more programmed surface defects 106 may include, but are not limited to, one or more voids, one or more shorts, one or more particles, one or more residues, scum, or any other defect known in the semiconductor industry.

The one or more programmed surface defects 106 may be set in any arrangement on the surface of the wafer 102. For example, the one or more programmed surface defects 106 may be set in a regularly-spaced array including, but not limited to, a line-space array, a repeating structure array, a hole array, or the like. In this regard, the one or more programmed surface defects 106 may include a selected periodicity (e.g., are separated by a substantially similar spacing). It is noted herein, however, that the one or more programmed surface defects 106 may be set in an irregularly-spaced array. It is additionally noted herein, however, that the one or more programmed surface defects 106 may be set in a regularly or an irregularly-spaced pattern that is not an array. Therefore, the above description should not be interpreted as a limitation on the scope of the present disclosure but merely an illustration.

The wafer 102 and/or the one or more programmed surface defects 106 may be fabricated from any material known in the art of semiconductor fabrication. For example, the material may include, but is not limited to, air, silicon dioxide ($SiO_2$), silicon nitride (SiN), titanium nitride (TiN), germanium (Ge), tungsten (W), copper (Cu), nickel (Ni), ruthenium (Ru), aluminum (Al), aluminum oxide ($Al_2O_3$), monocrystalline silicon (Si), gallium arsenide (GaAs), indium phosphide (InP), an amorphous Si material, a poly Si material, or any other material used in the semiconductor industry. By way of another example, the one or more programmed surface defects 106 may be a vacuum.

FIGS. 1C and 1D generally illustrate the DSW 100, in accordance with one or more embodiments of the present disclosure. It is noted herein that FIG. 1C represents a top view of the DSW 100, while FIG. 1D represents a cross-section view of the DSW 100 at the dotted line illustrated in FIG. 1C.

In one embodiment, the DSW 100 includes a planarized layer 108 deposited on the one or more programmed surface defects 106. For example, the planarized layer 108 may be fabricated from, but is not limited to, an $SiO_2$ material. In another embodiment, the planarized layer 108 is planed via a process including, but not limited to, chemical mechanical polishing (CMP). In another embodiment, a top surface of the planarized layer 108 provides no indication of the one or more programmed surface defects 106. In another embodiment, burying the one or more programmed surface defects 106 under a planarized layer 108 provides a foundation for a calibration structure, where the calibration structure may be utilized for the calibration of three-dimensional semiconductor device characterization tools (e.g., optical inspection tools or electrical inspection tools).

FIGS. 2A-2C generally illustrate a calibration structure 200 for measuring buried defects on a three-dimensional semiconductor device, in accordance with one or more embodiments of the present disclosure.

In one embodiment, the calibration structure 200 includes the DSW 100. For example, the DSW 100 may include the wafer 102, the one or more polygons 104, the one or more programmed surface defects 106, and the planarized layer 108.

In another embodiment, the calibration structure 200 includes a layer stack 202. In another embodiment, the layer stack 202 includes one or more layers (e.g., one or more layers 204 and/or one or more layers 206) deposited on top of the DSW 100, such that the calibration structure 200 includes one or more buried programmed surface defects 106. For example, the one or more alternating layers may include, but are not limited to, a resist, a ceramic material, a dielectric material, a conductive material, and/or a semiconductive material. By way of another example, the one or more layers 204 and/or the one or more layers 206 forming the layer stack 202 may be repeated one or more times. For instance, the one or more layers 204 and/or the one or more layers 206 may be alternating or non-alternating. Additionally, the one or more layers 204 and/or the one or more layers 206 may be fabricated from substantially similar or different materials. Many different types of such layers are known in the art, and the term wafer as used herein is intended to encompass a wafer 102 on which all types of such layers 204, 206 may be formed.

Formation and processing of such layers of material may ultimately result in completed calibration structures 200. For example, the calibration structure 200 may include one or more programmed surface defects 106 buried underneath an $SiO_2$ planarized layer 108 and a layer stack 202 including alternating hafnium oxide ($HfO_2$) layers 204 and $SiO_2$ layers 206. For instance, the layer stack 202 may include 54 alternating $HfO_2$ layers 204 and $SiO_2$ layers 206. By way of another example, the calibration structure 200 may include one or more programmed surface defects 106 buried underneath an Si planarized layer 108 and a layer stack 202 including alternating SiN layers 204 and Si layers 206. For instance, the layer stack 202 may include 72 alternating Si layers 204 and SiN layers 206.

In another embodiment, a cap layer 208 is placed on the layer stack 202. The cap layer 208 may be fabricated from any material known in the art of semiconductor fabrication. For example, the material may include, but is not limited to, an Si layer or a $SiO_2$ layer. In another embodiment, one or more holes 210 are patterned and etched through the cap layer 208 and the layer stack 202. For example, the one or more holes 210 may substantially align with the one or more programmed surface defects 106 (e.g., include a substantially similar periodicity). By way of another example, the one or more holes 210 may not substantially align with the one or more programmed surface defects 106 (e.g., include a different periodicity).

In another embodiment, the calibration structure 200 includes one or more air gaps 212 oriented substantially perpendicular to the one or more holes 210. For example, the one or more air gaps 212 may be formed via an etching process to remove material from the layer stack 202. For instance, the one or more air gaps 212 may be generated by removing at least a portion of the one or more layers 204 (e.g., $HfO_2$ layers 204 or SiN layers 204).

The planarized layer 108 may be any thickness used in the semiconductor device industry (e.g., the 3D NAND semiconductor industry). Additionally, the one or more layers 204 and/or the one or more layers 206 may be any thickness used in the semiconductor device industry (e.g., the 3D NAND semiconductor industry), such that the layer stack 202 is any total thickness used in the semiconductor device industry (e.g., the 3D NAND semiconductor industry). For example, the thickness of the one or more layers 204 and/or the one or more layers 206 may range from 10 to 50 nm, or alternatively be any layer thickness used in the semiconductor device industry (e.g., the 3D NAND semiconductor industry). The one or more layers 204 and/or the one or more layers 206 may be fabricated from any deposition material used in the semiconductor device industry (e.g., the 3D NAND semiconductor industry). For example, the layers 108, 204, 206 may be fabricated from a material including, but not limited to, $SiO_2$, SiN, poly Si, $HfO_2$, $ZrO_2$, $TiO_2$, $AlO_2$, W, Ni, or any material used in the semiconductor device industry (e.g., the 3D NAND semiconductor industry).

It is noted herein that any of the planarized layer 108, the one or more layers 204 and/or the one or more layers 206 of the layer stack 202, and/or the cap layer 208 may be a thin film layer or a thick film layer (e.g., a thin film planarized layer 108, a thick film planarized layer 108, or the like).

It is additionally noted herein the selection of the fabrication material for the planarized layer 108 and the one or more layers 204 and/or the one or more layers 206 of the layer stack 202 may be selected to ensure buried defects are visible during an inspection process. For example, the layer material may be selected for a particular absorbing or non-absorbing parameter. By way of another example, the layer material may be selected for a particular range of wavelength transmission and/or reflection.

It is additionally noted herein the arrangement of the one or more layers 204 and/or the one or more layers 206 forming the layer stack 202 may result in the calibration structure 200 being a substantially similar structure to 3D NAND semiconductor devices currently known in the semiconductor industry.

Although embodiments of the present disclosure are directed to two or more of the planarized layer 108, the one or more layers 204 and/or the one or more layers 206 of the layer stack 202, and/or the cap layer 208 being fabricated from the same material, it is noted herein that the planarized layer 108, the one or more layers 204 and/or the one or more layers 206 of the layer stack 202, and/or the cap layer 208 may each be fabricated from different materials known in the semiconductor device industry (e.g., the 3D NAND semiconductor industry). Therefore, the above description should not be interpreted as a limitation on the scope of the present disclosure but merely an illustration.

Figure 4:
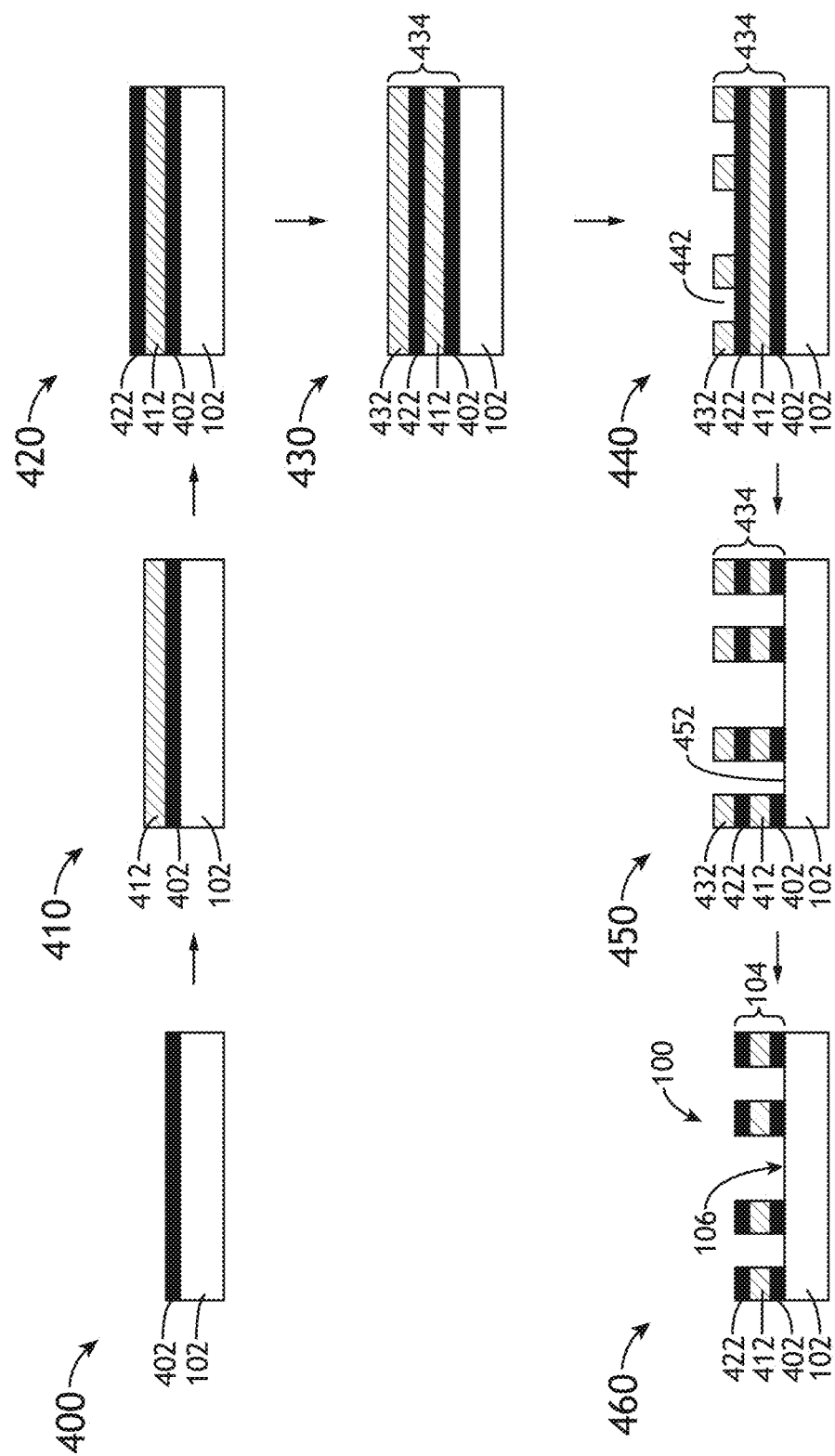
FIG. 4 illustrates a set of conceptual views of a film/coating deposition process to fabricate a DSW, in accordance with one or more embodiments of the present disclosure.

FIG. 3 illustrates a process flow diagram depicting a film/coating deposition method 300 for fabricating one or more programmed surface defects 106 on the wafer 102 of the DSW 100, in accordance with one or more embodiments of the present disclosure. FIG. 4 illustrates a set of conceptual views of the fabrication of the one or more programmed surface defects 106 via the method 300, in accordance with one or more embodiments of the present disclosure.

In step 302, a first film 402 is deposited on the wafer 102, as illustrated in view 400 of FIG. 4. In one embodiment, the wafer 102 is a Si wafer. In another embodiment, the first film 402 is a $SiO_2$ film. For example, the $SiO_2$ film may be grown via a thermal or high temperature oxide (HTO) process. By way of another example, the $SiO_2$ film may range from 50 to 500 Å in thickness. For instance, the $SiO_2$ film may be 100 Å in thickness.

In step 304, a second film 412 is deposited on the first film 402, as illustrated in view 410 of FIG. 4. In one embodiment, the second film 412 is a silicon oxynitride (SiON) film. For example, the SiON film may be grown via plasma-enhanced chemical vapor deposition (PECVD) or low-pressure chemical vapor deposition (LPCVD). By way of another example, the SiON film may range from 50 to 500 Å in thickness. For instance, the SiON film may be 300 Å in thickness. By way of another example, the second film 412 may include an anti-reflective (AR) film. For instance, the second film 412 may include a 248 nm AR film. Additionally, the second film 412 may include a bottom anti-reflective coating (BARC) film.

In step 306, a third film 422 is deposited on the second film 412, as illustrated in view 420 of FIG. 4. In one embodiment, the third film 422 is an $SiO_2$ film. For example, the $SiO_2$ film may be grown via a PECVD with liquid tetraethoxysilane (TEOS) process. By way of another example, the $SiO_2$ film may range from 50 to 500 Å in thickness. For instance, the $SiO_2$ film may be 100 Å in thickness.

In step 308, a resist 432 is spun on the third film 422, as illustrated in view 430 of FIG. 4. In one embodiment, the resist 432 is a high resolution positive resist. In another embodiment, the first film 402, the second film 412, the third film 422, and the resist 432 form a material stack 434.

In step 310, the resist 432 is exposed and developed, as illustrated in view 440 of FIG. 4. In one embodiment, the resist 432 is exposed and developed to include one or more holes 442, where the one or more holes 442 extend through the resist 432 to the third layer 422.

In step 312, material is etched from the patterned first film 402, second film 412, and third film 422, as illustrated in view 450 of FIG. 4. In one embodiment, the first film 402, the second film 412, and the third film 422 are patterned and etched at the exposed and developed location of the resist 432. In another embodiment, the first film 402, the second film 412, and the third film 422 are patterned and etched down to a surface of the wafer 102.

In step 314, the resist 432 is removed to form the one or more programmed surface defects 106, as illustrated in view 460 of FIG. 4. In one embodiment, the resulting structures remaining following the removal of the resist 432 from the first film 402, the second film 412, and the third film 422 form the one or more polygons 104 of the DSW 100.

It is noted herein that steps 308 and 310 may be considered as process for patterning the DSW 100. It is additionally noted herein that steps 308, 310, 312, and 314 may be considered as a process for patterning the DSW 100. Therefore, the above description should not be interpreted as a limitation on the scope of the present disclosure but merely an illustration.

Although embodiments of the present disclosure are directed to forming the one or more programmed surface defects 106 on the wafer 102 via the method 300, it is noted herein the one or more programmed surface defects 106 may be formed on the wafer 102 via any deposition or fabrication process known in the semiconductor industry. Therefore, the above description should not be interpreted as a limitation on the scope of the present disclosure but merely an illustration.

It is noted herein the method 300 is not limited to the steps provided. For example, the method 300 may instead include more or fewer steps. By way of another example, the method 300 may perform the steps in an order other than provided. Therefore, the above description should not be interpreted as a limitation on the scope of the present disclosure but merely an illustration.

Figure 5:
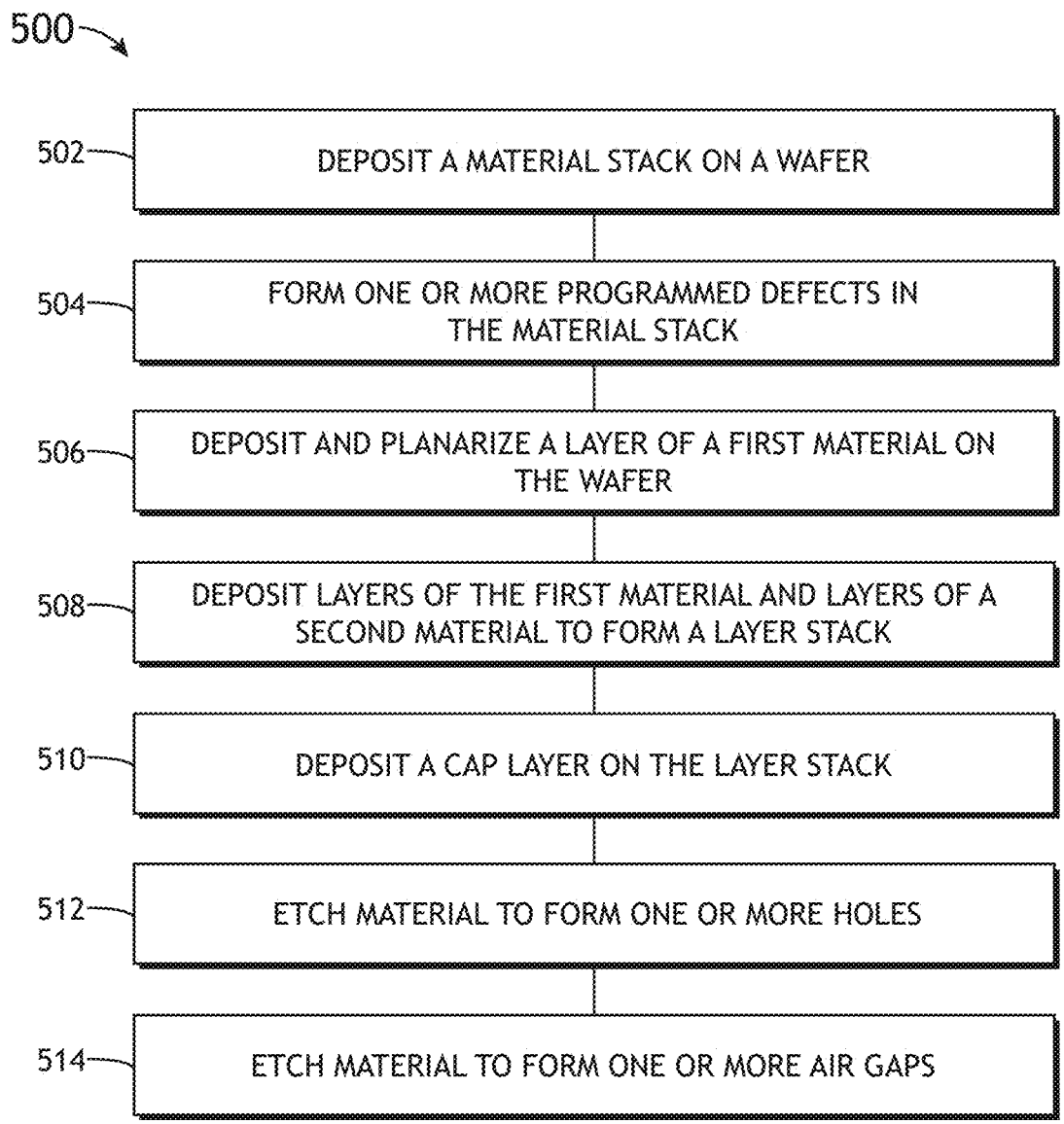
FIG. 5 illustrates a process flow diagram depicting a film/coating deposition process to fabricate a three-dimensional calibration structure for measuring buried defects of a three-dimensional semiconductor device, in accordance with one or more embodiments of the present disclosure.
Figure 6A:
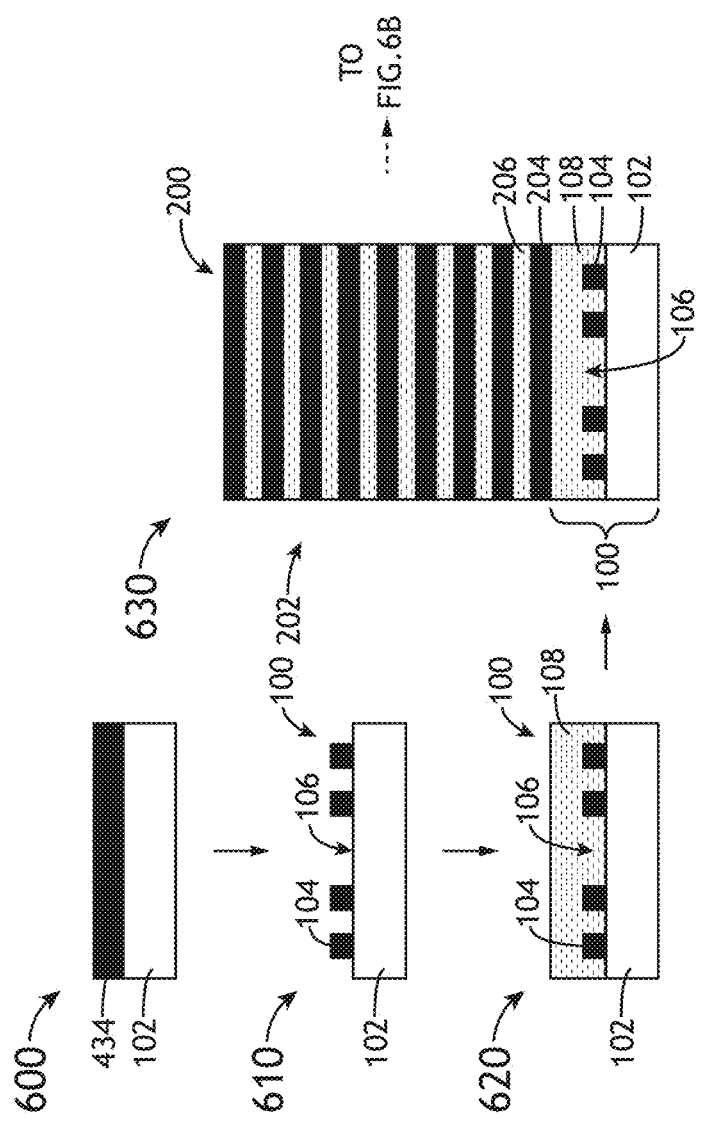
FIG. 6A illustrates a set of conceptual views of a film/coating deposition process to fabricate a three-dimensional calibration structure for measuring buried defects of a three-dimensional semiconductor device, in accordance with one or more embodiments of the present disclosure.
Figure 6B:
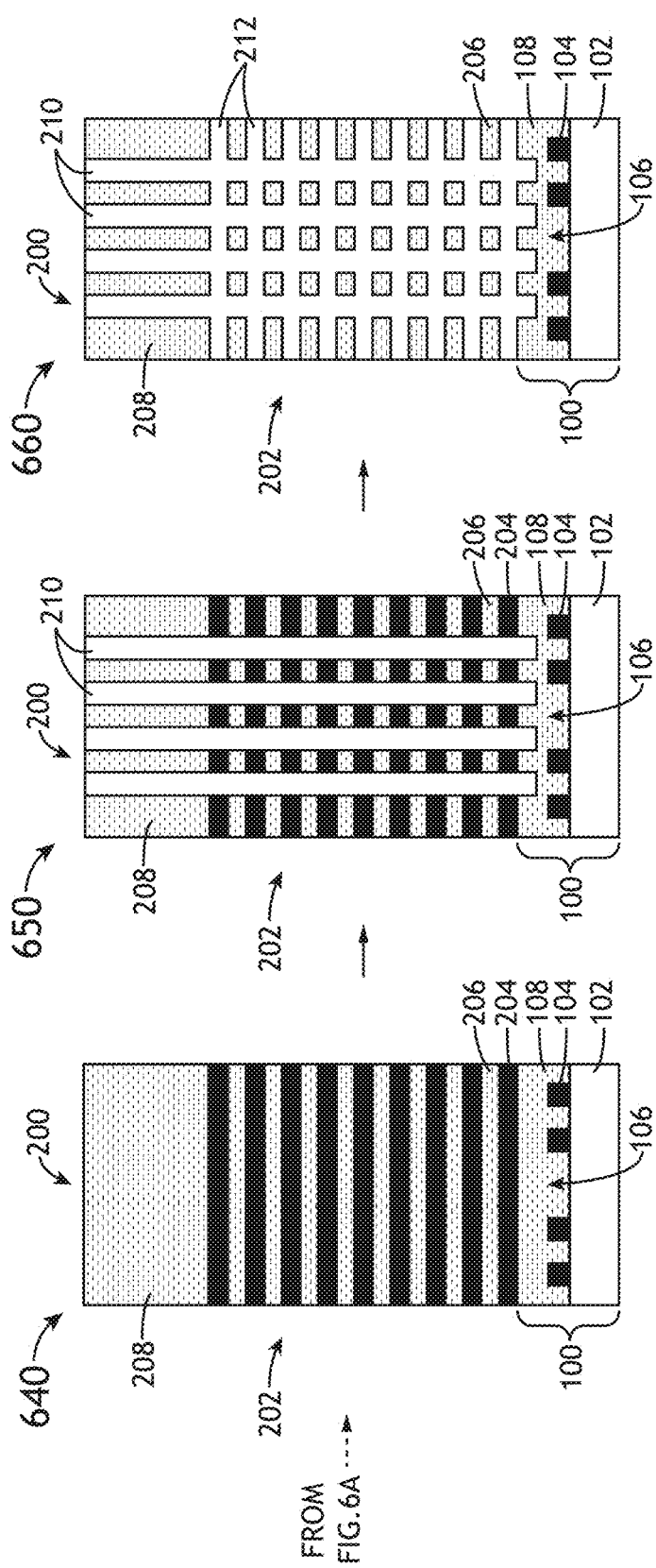
FIG. 6B illustrates a set of conceptual views of a film/coating deposition process to fabricate a three-dimensional calibration structure for measuring buried defects of a three-dimensional semiconductor device, in accordance with one or more embodiments of the present disclosure.

FIG. 5 illustrates a process flow diagram depicting a film/coating deposition method 500 to fabricate the calibration structure 200 for measuring buried defects on a three-dimensional semiconductor device, in accordance with one or more embodiments of the present disclosure. FIGS. 6A and 6B illustrate conceptual views of the formation of the calibration structure 200 via the method 500, in accordance with one or more embodiments of the present disclosure.

In step 502, a material stack 434 is deposited on a wafer 102, as illustrated in view 600 of FIG. 6A. In step 504, one or more programmed surface defects 106 are formed from the material stack 434, as illustrated in view 610 of FIG. 6A. For example, the material stack 434 may be patterned and/or etched to form the one or more programmed surface defects 106. It is noted herein steps 502 and 504 may correspond to some or all of the steps of the method 300, as disclosed previously herein.

In step 506, a layer 108 of a first material is deposited on the wafer 102 and the one or more programmed surface defects 106 and subsequently planarized, as illustrated in view 620 of FIG. 6A. The planarized layer 108 may be fabricated from any material known in the art of semiconductor fabrication. For example, the planarized layer 108 may be, but is not limited to, an $SiO_2$ layer. The planarization process may be any planarization process known in the art of semiconductor fabrication. For example, the planarization process may include, but is not limited to, spin-on-glass (SOG) deposition, chemical mechanical polishing (CMP), or the like. However, it is noted herein the layer 108 does not need to be planarized. Therefore, the above description should not be interpreted as a limitation on the scope of the present disclosure but merely an illustration.

In step 508, the one or more layers 204 and/or the one or more layers 206 are deposited on the planarized layer 108 to form a layer stack 202, as illustrated in view 630 of FIG. 6A. In one embodiment, the one or more layers 204 and/or the one or more layers 206 are alternating layers. It is noted herein, however, that the layer stack 202 may not be entirely constructed by alternating the one or more layers 204 and/or the one or more layers 206. For example, the layer stack 202 may include repeating the one or more layers 204 and/or the one or more layers 206 during deposition, where the repeat layers are deposited separately. The one or more layers 204 and/or the one or more layers 206 may be fabricated from any material known in the art of semiconductor fabrication. For example, the one or more layers 206 may be fabricated from a different material than the one or more layers 204. By way of another example, the one or more layers 206 may be fabricated from the same material as the planarized layer 108. It is noted herein, however, that the material of the one or more layers 206 and the material of the one or more layers 204 may be the same material. The layer stack 202 may be constructed from one or more layers 204 and one or more layers 206 that are of substantially equal thickness or of different thicknesses. For instance, a single layer of the layer stack 202 may be of an equivalent thickness to an alternating dielectric-metal-dielectric layer sub-stack in the layer stack 202.

In step 510, a cap layer 208 is deposited on the layer stack 202, as illustrated in view 640 of FIG. 6B. In one embodiment, the layer stack 202 includes alternating layers 204, 206 sandwiched between the planarized layer 108 and the cap layer 208. For example, the cap layer 208 may be fabricated from the same material as the planarized layer 108. For instance, the cap layer 208 and the planarized layer 108 may be fabricated from $SiO_2$. In another embodiment, the cap layer 208 may be of a select thickness. For example, the select thickness of the cap layer 208 may range from 1 to 10 μm. It is noted herein that the cap layer 208 may be thicker than any of the layers 204, 206 that form the layer stack 202.

In step 512, material is etched to form the one or more holes 210, as illustrated in view 650 of FIG. 6B. In one embodiment, the one or more holes 210 includes one or more holes, one or more patterned structures, and/or a line array. The one or more holes 210 may be dimensioned to be substantially similar to those used in 3D NAND semiconductor devices currently known in the semiconductor industry. For example, the one or more holes 210 may range from 50 to 250 nm in diameter. By way of another example, the one or more holes 210 may range from 1 to 10 μm in depth.

In another embodiment, the one or more holes 210 are patterned onto at least one of the layer stack 202 and/or the cap layer 208 of the calibration structure 200. In another embodiment, the one or more holes 210 are etched into at least one of the layer stack 202 and/or the cap layer 208 of the calibration structure 200. In another embodiment, the one or more holes 210 are etched with a high-aspect ratio to the one or more programmed surface defects 106. In another embodiment, the calibration structure 200 utilizes the one or more holes 210 with one or more modulation experiments to induce under-etch or over-etch defect regions. The induced under-etch or over-etch defect regions may be dimensioned to be substantially similar to those used in 3D NAND semiconductor devices currently known in the semiconductor industry.

In step 514, material is etched to form the one or more air gaps 212, as illustrated in view 660 of FIG. 6B. In one embodiment, the calibration structure 200 utilizes the one or more air gaps 212 to induce one or more identifiable patterns in the remaining non-etched material. For example, the one or more identifiable patterns may include, but are not limited to, nozzle spray, swirls, crescent wafer signature patterns, or the like. In another embodiment, the one or more air gaps 212 are patterned onto at least one of the layer stack 202 and/or the cap layer 208 of the calibration structure 200. In another embodiment, the one or more air gaps 212 are etched into at least one of the layer stack 202 and/or the cap layer 208 of the calibration structure 200. The location of the etched air gaps and/or the remaining material may be substantially similar to that used in 3D NAND semiconductor devices currently known in the semiconductor industry.

The deposition process in steps 302, 304, 306, 502, 506, 508 and/or 510 may include any deposition process known in the art of semiconductor fabrication. For example, the deposition process may include, but is not limited to, sputtering, physical vapor deposition (PVD), PECVD, atomic layer deposition (ALD), or the like.

The patterning process in steps 308, 310, 312, 314, 504 and/or 512 may include any patterning process known in the art of semiconductor fabrication. For example, the patterning process may include, but is not limited to, contact or free-space metal mask with EUV, VUV, DUV, or UV exposure of positive or negative photoresists and subsequent development of the exposed photoresist. The holes generated by the patterning process in steps 504 and/or 512 may include any pattern arrangement known in the art of semiconductor fabrication. For example, the generated pattern may be, but are not limited to, a repeating line-space, a repeating pattern, a hole array, or the like.

The etching process in steps 504, 512, and/or 514 may include any etching process known in the art of semiconductor fabrication. For example, the etching process may include, but is not limited to, reactive ion etching (RIE), deep-RIE (DRIE), inductively-coupled plasma (ICP) etching, wet chemical etching (e.g., with SiN, metal, or poly Si), atomic layer etching (ALE), or the like.

It is noted herein the method 500 is not limited to the steps provided. For example, the method 500 may instead include more or fewer steps. By way of another example, the method 500 may perform the steps in an order other than provided. Therefore, the above description should not be interpreted as a limitation on the scope of the present disclosure but merely an illustration.

Figure 7:
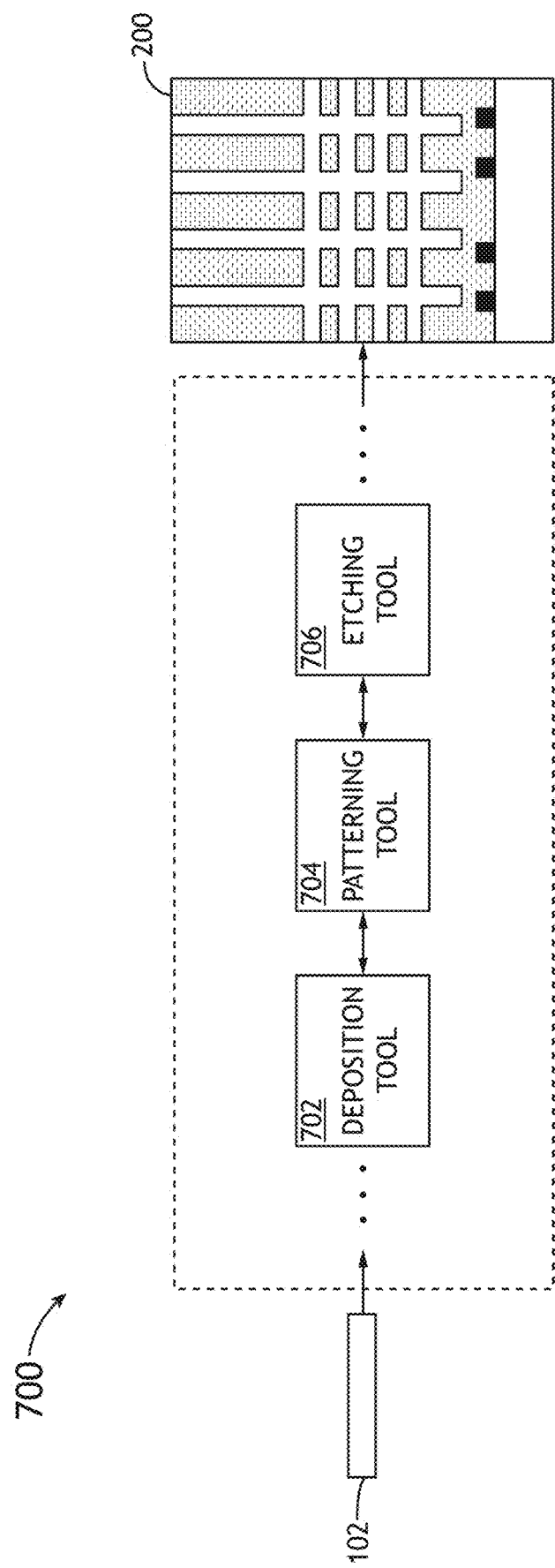
FIG. 7 illustrates a system for fabricating a three-dimensional calibration structure for measuring buried defects of a three-dimensional semiconductor device, in accordance with one or more embodiments of the present disclosure.

FIG. 7 illustrates a system 700 for fabricating the calibration structure 200, in accordance with one or more embodiments of the present disclosure.

In one embodiment, the system 700 includes one or more deposition tools 702. In another embodiment, the system 700 includes one or more patterning tools 704. In another embodiment, the system 700 includes one or more etching tools 706. In another embodiment, the one or more deposition tools 702, the one or more patterning tool 704, and/or the one or more etching tools 706 may be a single combined tool.

In another embodiment, the calibration structure 200 is manufactured using one or more sets of wafer design data. In another embodiment, the one or more sets of wafer design data includes instructions to deposit one or more layers to form the layer stack 202. In another embodiment, the one or more deposition tools 702 accept and deposit one or more layers. For example, the one or more layers may be deposited directly onto the wafer 102. By way of another example, the one or more layers may be deposited on a layer previously-deposited onto the wafer 102.

In another embodiment, the one or more patterning tools 704 and/or the one or more etching tools 706 receive the wafer 102 following the deposition of the one or more layers on the wafer 102. For example, the one or more patterning tools 704 and/or the one or more etching tools 706 may generate the one or more programmed surface defects 106. By way of another example, the one or more patterning tools 704 and/or the one or more etching tools 706 may generate the one or more holes 210 and/or the one or more air gaps 212 following the fabrication of the layer stack 202. In another embodiment, the wafer 102 is transferred back and forth between the one or more deposition tools 702, the one or more patterning tools 704, and/or the one or more etching tools 706 one or more times when fabricating the calibration structure 200.

It is noted herein the one or more deposition tools 702, the one or more patterning tools 704, and/or the one or more etching tools 706 may receive a pre-fabricated DSW 100 and perform some or all of the steps of the method 500 to fabricate the calibration structure 200. It is additionally noted herein, however, that the one or more deposition tools 702, the one or more patterning tools 704, and/or the one or more etching tools 706 may receive a bare wafer 102 and perform some or all of the steps of the method 300 to fabricate the DSW 100 prior to performing at least the steps of the method 500 to fabricate the calibration structure 200.

In another embodiment, the system 700 includes one or more planarization tools (not shown). For example, the one or more planarization tools may smooth a surface of a previously-deposited layer. In another embodiment, the one or more planarization tools are standalone or are integrated into the one or more deposition tools 702.

In another embodiment, the system 700 includes one or more characterization tools (e.g., one or more inspection tools including, but not limited to, one or more interferometers). In another embodiment, the one or more characterization tools are used to monitor one or more layer parameters during deposition of a layer. For example, the interferometer tools may monitor film stress between deposition steps. In another embodiment, the wafer 102 may be transferred to the one or more deposition tools 702, the one or more patterning tool 704, and/or the one or more etching tools 706 following the obtaining of the one or more measurements of the wafer 102 via the one or more characterization tools for the application of a new layer, where the new layer is adjusted based on the measurements taken with the one or more characterization tools (e.g., a feedback loop). In another embodiment, the same layer may be deposited on a subsequent wafer 102, where the layer is adjusted based on the measurements taken with the one or more interferometers tools (e.g., a feed forward loop).

Figure 8:
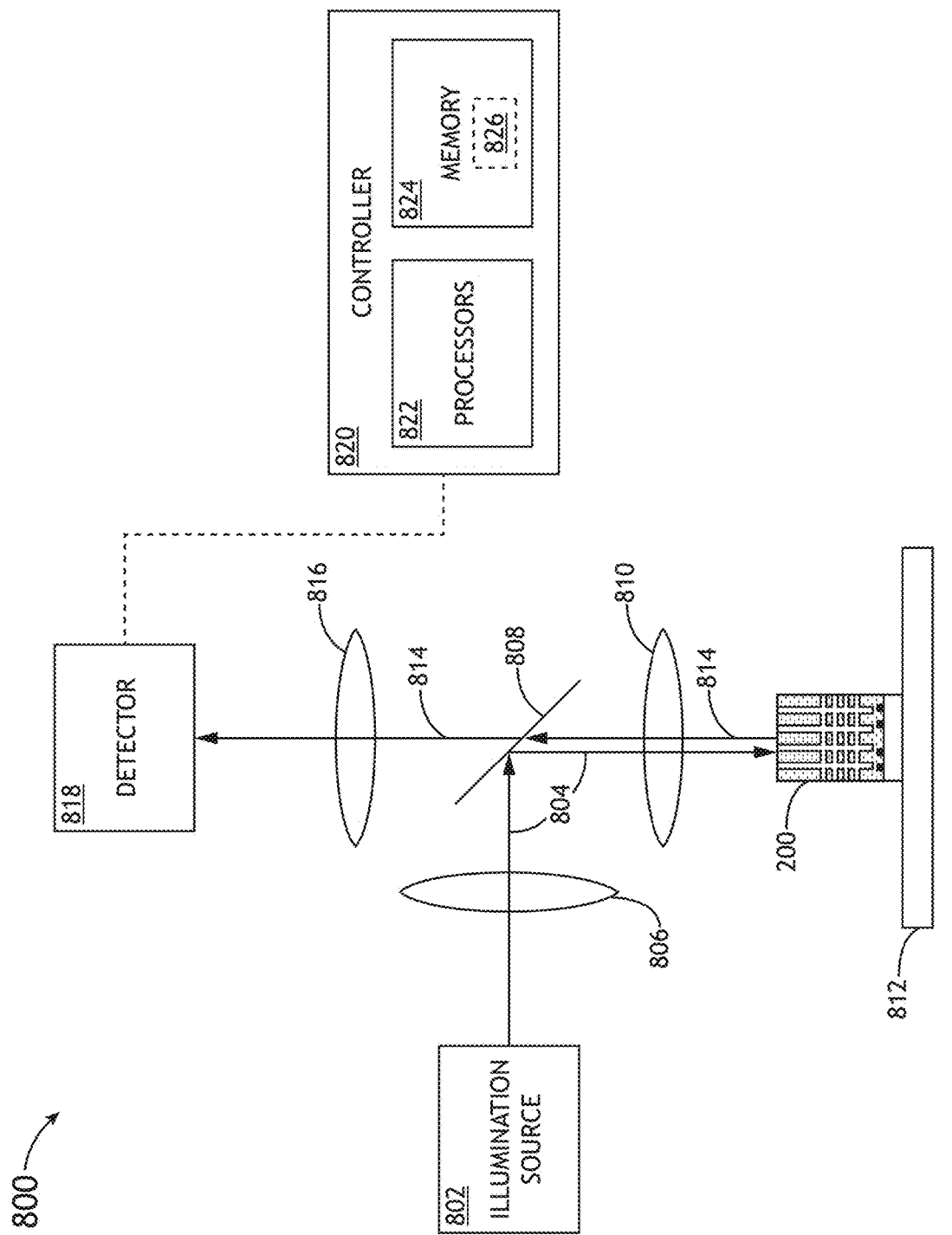
FIG. 8 illustrates a characterization tool including a three-dimensional calibration structure for measuring buried defects of a three-dimensional semiconductor device, in accordance with one or more embodiments of the present disclosure.

FIG. 8 illustrates a characterization tool 800 including the calibration structure 200, in accordance with one or more embodiments of the present disclosure.

The characterization tool 800 may include any characterization tool known in the art. For example, the characterization tool 800 may include, but not limited to, an inspection tool or review tool. For instance, the inspection tool may include, but is not limited to, an optical inspection tool. Additionally, the optical inspection tool may include an optical inspection tool capable of generating one or more high-resolution images representing the electrical intent of the calibration structure 200. Further, the optical inspection tool may include a broadband inspection tool including, but not limited to, a laser sustained plasma (LSP) based inspection tool. Further, the optical inspection tool may include a narrowband inspection tool, such as, but not limited to, a laser scanning inspection tool. Further, the optical inspection tool may include, but is not limited to, a brightfield inspection tool or a darkfield inspection tool. It is noted herein that the characterization tool 800 may include any optical tool configured to collect and analyze illumination reflected, scattered, diffracted, and/or radiated from the calibration structure 200. By way of another example, the characterization tool 800 may include, but is not limited to, a scanning electron microscopy (SEM) review tool. In a general sense, although not shown here, the characterization tool 800 may include any inspection tool suitable for inspecting one or more wafers, reticles, or photomasks.

In one embodiment, the characterization tool 800 includes an illumination source 802. The illumination source 802 may include any illumination source known in the art configured to generate radiation. For example, the illumination source 802 may include, but is not limited to, a broadband illumination source (e.g. a Xenon lamp) or a narrowband illumination source (e.g. a laser). By way of another example, the illumination source 802 may be configured to generate DUV, UV, VUV, and/or EUV illumination. For instance, the EUV illumination source may include a discharge produced plasma (DPP) illumination source or a laser produced plasma (LPP) illumination source configured to generate illumination in the EUV range. By way of another example, the illumination source 802 may be configured to generate X-ray radiation.

In another embodiment, the illumination source 802 generates and directs illumination 804 (e.g. a beam of illumination) to the surface of the calibration structure 200 disposed on a sample stage 812. For example, the illumination source 802 may be configured to direct illumination to the surface of the calibration structure 200 disposed on the sample stage 812 via one or more of a set of optical elements 806, a beam splitter 808, and/or a set of optical elements 810. It is noted herein the set of optical elements 806 and/or the set of optical elements 810 may include any optical element known in the art suitable for focusing, suppressing, extracting, and/or directing the illumination 804. It is additionally noted herein the set of optical elements 806, the beam splitter 808, and the set of optical elements 810 may be considered to be a set of focusing optics for purposes of the present disclosure.

The sample stage 812 may include any appropriate mechanical and/or robotic assembly known in the art. In one embodiment, the sample stage 812 is an actuatable stage. For example, the sample stage 812 may include, but is not limited to, one or more translational stages suitable for selectably translating the calibration structure 200 along one or more linear directions (e.g., x-direction, y-direction, and/or z-direction). By way of another example, the sample stage 812 may include, but is not limited to, one or more rotational stages suitable for selectively rotating the calibration structure 200 along a rotational direction. By way of another example, the sample stage 812 may include, but is not limited to, a rotational stage and a translational stage suitable for selectably translating the sample along a linear direction and/or rotating the calibration structure 200 along a rotational direction. By way of another example, the sample stage 812 may be configured to translate or rotate the calibration structure 200 for positioning, focusing, and/or scanning in accordance with a selected inspection or metrology algorithm, several of which are known to the art.

In another embodiment, the characterization tool 800 is configured to detect one or more defects in the calibration structure 200. In another embodiment, the characterization tool 800 detects defects on the calibration structure 200 via one or more detectors 818. The one or more detectors 818 may be any detector known in the art. For example, the one or more detectors 818 may include, but is not limited to, photo-multiplier tubes (PMTs), charge coupled devices (CCDs), a time-delay integration (TDI) camera, and the like. In addition, the output of the one or more detectors 818 may be operably coupled to a controller 820, as described in detail further herein.

In another embodiment, the calibration structure 200 reflects, scatters, diffracts, and/or radiates illumination 814 (e.g. a beam of illumination) in response to the illumination 804. In another embodiment, the illumination 814 is directed to the one or more detectors 818. For example, the illumination 814 may be directed to the one or more detectors 818 via one or more of the set of optical elements 810, the beam splitter 808, and/or a set of optical elements 816. It is noted herein the set of optical elements 810 and/or the set of optical elements 816 may include any optical element known in the art suitable for focusing, suppressing, extracting, and/or directing the illumination 814. It is additionally noted herein the set of optical elements 810, the beam splitter 808 and the set of optical elements 816 may be considered to be a set of collection optics for purposes of the present disclosure.

In one embodiment, the characterization tool 800 includes the controller 820. In another embodiment, the controller 820 is operably coupled to one or more components of the characterization tool 800. For example, the controller 820 may be operably coupled to the illumination source 802, the sample stage 812, and/or the one or more detectors 818. In this regard, the controller 820 may direct any of the components of the characterization tool 800 to carry out any one or more of the various functions described throughout the present disclosure. In another embodiment, the controller 820 includes one or more processors 822 and memory 824. The memory 824 may store a set of program instructions 826.

The controller 820 may be configured to receive and/or acquire data or information from other systems or tools (e.g., one or more sets of information from the illumination source 802, the sample stage 812, and/or the one or more detectors 818) of the characterization tool 800 by a transmission medium that may include wireline and/or wireless portions. The controller 820 may additionally be configured to transmit data or information (e.g., the output of one or more procedures of the inventive concepts disclosed herein) to one or more systems or tools (e.g., one or more sets of information from the illumination source 802, the sample stage 812, and/or the one or more detectors 818) of the characterization tool 800 by a transmission medium that may include wireline and/or wireless portions. In this regard, the transmission medium may serve as a data link between the controller and the other subsystems of the characterization tool 800. Additionally, the controller 820 may be configured to send data to external systems via a transmission medium (e.g., network connection).

The one or more processors 822 may include any one or more processing elements known in the art. In this sense, the one or more processors 822 may include any microprocessor device configured to execute algorithms and/or program instructions. For example, the one or more processors 822 may consist of a desktop computer, mainframe computer system, workstation, image computer, parallel processor, handheld computer (e.g. tablet, smartphone, or phablet), or other computer system (e.g., networked computer). In general, the term "processor" may be broadly defined to encompass any device having one or more processing elements, which execute the set of program instructions 826 from a non-transitory memory medium (e.g., the memory 824). Moreover, different subsystems of the characterization tool 800 (e.g., one or more sets of information from the illumination source 802, the sample stage 812, and/or the one or more detectors 818) may include processor or logic elements suitable for carrying out at least a portion of the steps described throughout the present disclosure. Therefore, the above description should not be interpreted as a limitation on the present disclosure but merely an illustration.

The memory 824 may include any storage medium known in the art suitable for storing the set of program instructions 826 executable by the associated one or more processors 822. For example, the memory 824 may include a non-transitory memory medium. For instance, the memory 824 may include, but is not limited to, a read-only memory, a random access memory, a magnetic or optical memory device (e.g., disk), a magnetic tape, a solid state drive, and the like. The memory 824 may be configured to provide display information to a display device of a user interface. The memory 824 may additionally be configured to store user input information from a user input device of the user interface. The memory 824 may be housed in a common controller 820 housing with the one or more processors 822. The memory 824 may, alternatively or in addition, be located remotely with respect to the spatial location of the processors 822 and/or the controller 820. For instance, the one or more processors 822 and/or the controller 820 may access a remote memory 824 (e.g., server), accessible through a network (e.g., internet, intranet, and the like).

In one embodiment, the illumination source 802 may be operably coupled to a set of positioners configured to actuate the illumination source 802 in one or more directions. For example, the controller 820 may direct the set of positioners to translate the illumination source 802 in one or more of an x-direction, a y-direction, and/or a z-direction to correct beam misalignment produced by any of the components of the characterization tool 800.

In one embodiment, the calibration structure 200 is utilized to calibrate, demonstrate, and/or establish baseline measurements for the characterization tool 800. In another embodiment, the calibration structure 200 is usable to test the ability of the characterization tool 800 to detect buried defects by inspecting the calibration structure 200 at different focal planes (e.g., at a surface plane and at a defect plane) and observing the resultant variation of the optical signal in one or more of the illumination propagation direction, the z-axis, or at the focal planes. Three-dimensional imaging for semiconductor wafer inspection is generally described in U.S. patent application Ser. No. 15/683,007, filed on Aug. 22, 2017, which is incorporated herein in its entirety.

Figure 9A:
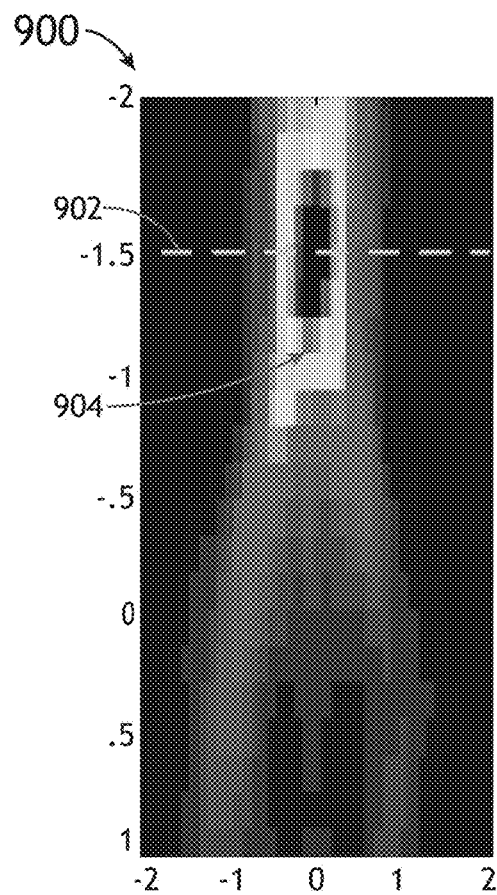
FIG. 9A illustrates a defect at a surface plane of a three-dimensional semiconductor device captured via a characterization tool, in accordance with one or more embodiments of the present disclosure.
Figure 9B:
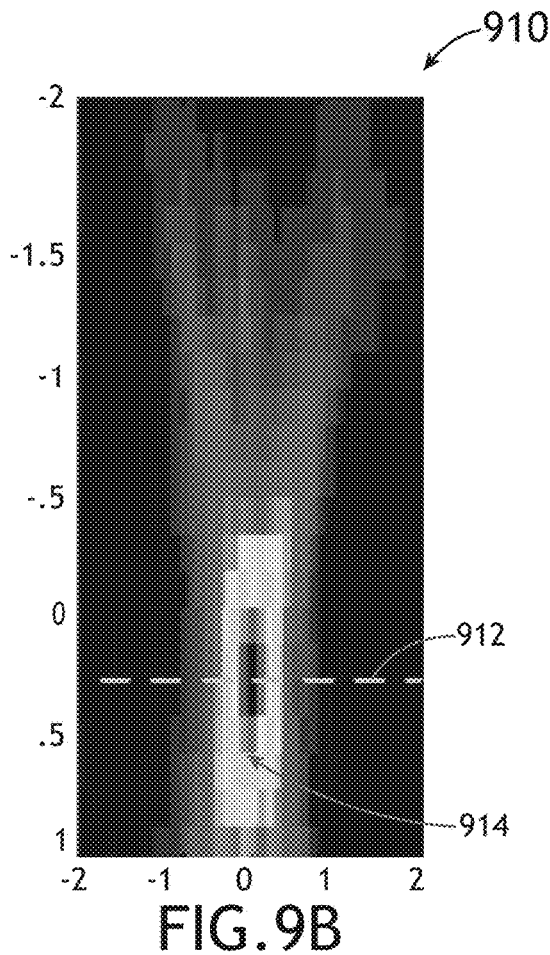
FIG. 9B illustrates a defect at a buried plane of a three-dimensional semiconductor device captured via a characterization tool, in accordance with one or more embodiments of the present disclosure.

FIGS. 9A and 9B generally illustrate a calibration structure 200 defect imaged via the characterization tool 800. In one embodiment, the characterization tool 800 includes a darkfield inspection tool, where the darkfield inspection tool captures images 900, 910. For example, the outer-lying dark areas of the images 900, 910 may denote low-intensity illumination of the darkfield inspection tool, while the inset-dark areas of the images 900, 910 may denote high-intensity illumination of the darkfield inspection tool.

Referring now to FIG. 9A, the three-dimensional image 900 includes a cross-section of the calibration structure 200 with a surface particle defect 904 (e.g., resulting from the fabrication process or contamination in transit) at a surface plane 902 across different focal planes (e.g., an axial z-direction and a lateral x-direction). As illustrated in the image 900, the surface defect 904 occurs at a focal plane that is offset from a value different from the calibrated zero focus offset. It is noted herein the zero focus offset may be referred to as the focus of the characterization tool 800, where a deviation from this reference point is called a focus offset (e.g., which can be positive or negative), for purposes of the present disclosure. Referring now to FIG. 9B, the three-dimensional image 910 includes a cross-section of the calibration structure 200 with a programmed line open defect 914 at a buried x-z plane 912 across different focal planes. As illustrated in the image 910, the surface defect 914 occurs at a focal plane corresponding to the system focusing into the calibration structure 200.

Figure 9C:
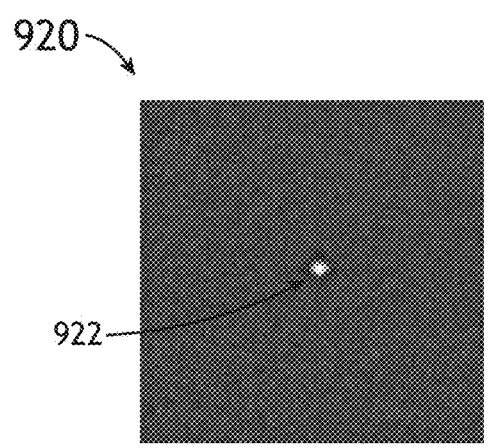
FIG. 9C illustrates a defect at a surface plane of a three-dimensional semiconductor device captured via a scanning electron microscopy (SEM) tool, in accordance with one or more embodiments of the present disclosure.
Figure 9D:
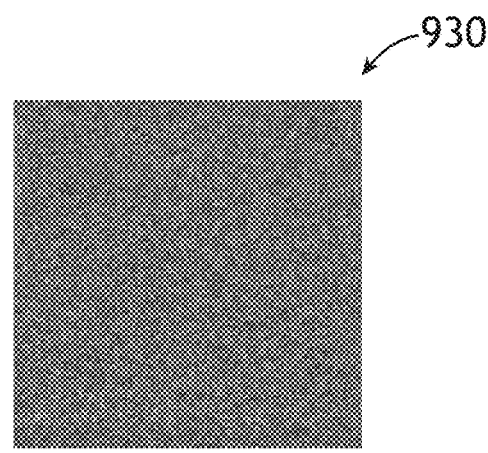
FIG. 9D illustrates a defect at a surface plane of a three-dimensional semiconductor device captured via a scanning electron microscopy (SEM) tool, in accordance with one or more embodiments of the present disclosure.

Although embodiments of the present disclosure are directed to an optical-based inspection tool as the characterization tool 800, it is noted herein the characterization tool 800 may instead include a scanning electron microscopy (SEM) review tool. However, it is noted herein the SEM review tool may be limited to observing surface-plane defects, as the SEM review tool may not be able to adequately probe the calibration structure 200 and image buried defects 914. For example, as illustrated in FIG. 9C, an SEM review tool with a field of view of 8 µm may image a surface defect 922, as illustrated in image 920. However, as illustrated in FIG. 9D, the SEM review tool with the field of view of 8 µm may not image a buried defect, as illustrated in image 930.

In another embodiment, the calibration structure 200 is usable to calibrate optical depth measurements of the characterization tool 800. The relative optical distance (e.g., measured by the focal plane or focus offset distance) may be utilized to measure the physical depth of a defect at a known location and compared the measurement with the known depth. For example, a depth D of the defect relative to the surface may be dependent on (1) the focus offset difference $\Delta z$ between the surface and the buried defect, and (2) the effective refractive index $n_{eff}$ of the surrounding calibration structure 200 and materials, as illustrated by EQ. 1:

$$D = \Delta z \cdot n_{eff} \qquad \text{EQ. 1}$$

In EQ. 1, $n_{eff}$ is a semi-homogenous weighted average of the refractive index of the materials to a first degree of approximation, where the weighting is the relative thickness of the material with select refractive indexes. For instance, where the $n_{eff}$ value is approximately 1.8 and the $\Delta z$ value is 1.87 µm, the measured D is 3.36 µm. In this instance, if a designed $D_d$ value is 3.33 µm, the depth measurement accuracy is within 30 nm of the expected location, or well within the known fabrication tolerance (e.g., 10% or 333 nm) of thin film deposition processes, resulting in a notably accurate depth measurement technique.

It is noted herein that determining $n_{eff}$ may require non-linear approximations and/or may account for different location dependencies to be accurate for physical arrangements and/or fabricating materials different than those of the calibration structure 200. Therefore, the above description should not be interpreted as a limitation on the scope of the present disclosure but merely an illustration.

Figure 10:
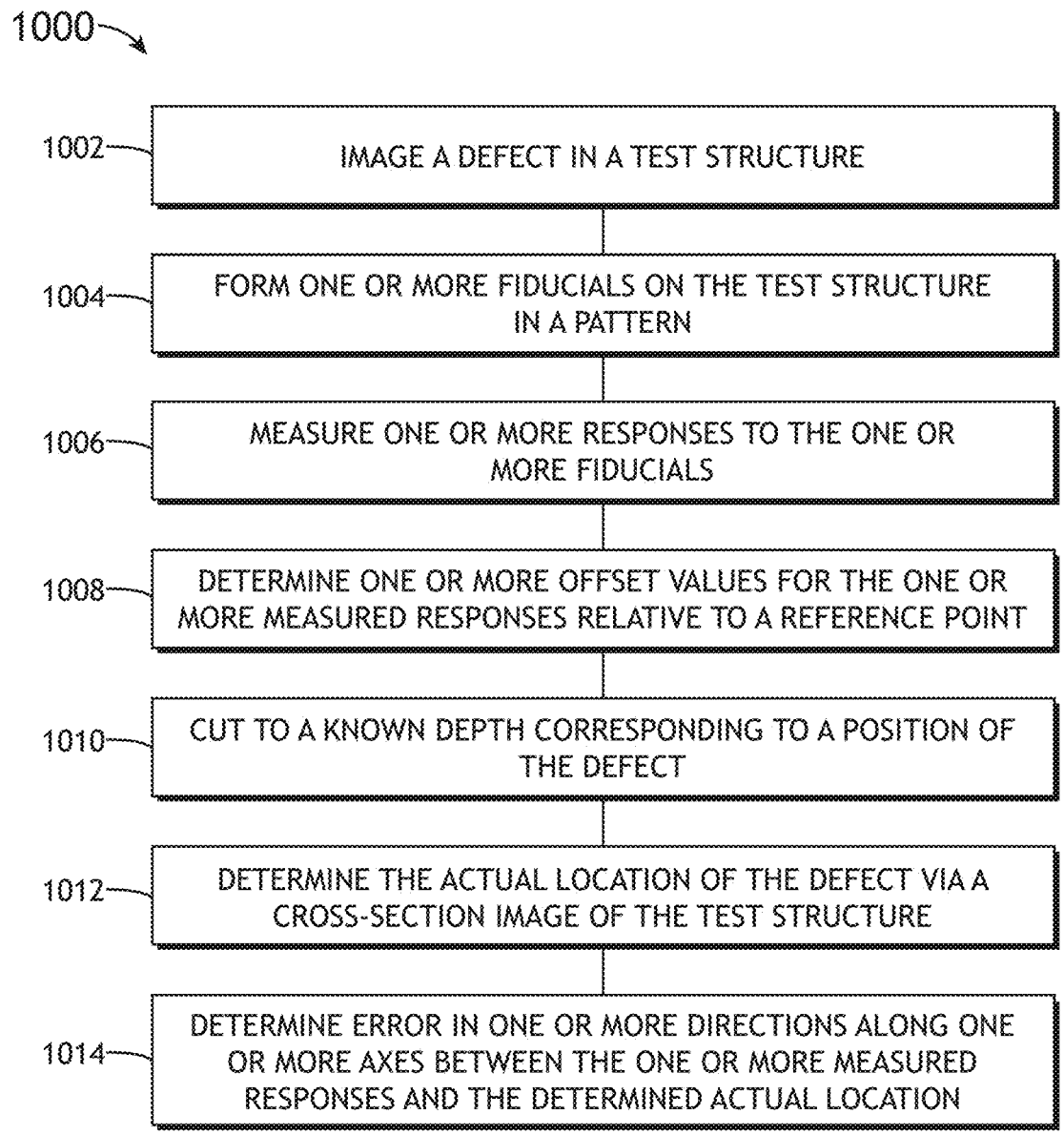
FIG. 10 illustrates a process flow diagram depicting a process to determine an accuracy of imaging a defect in the three-dimensional calibration structure via multiple tools, in accordance with one or more embodiments of the present disclosure.
Figure 11A:
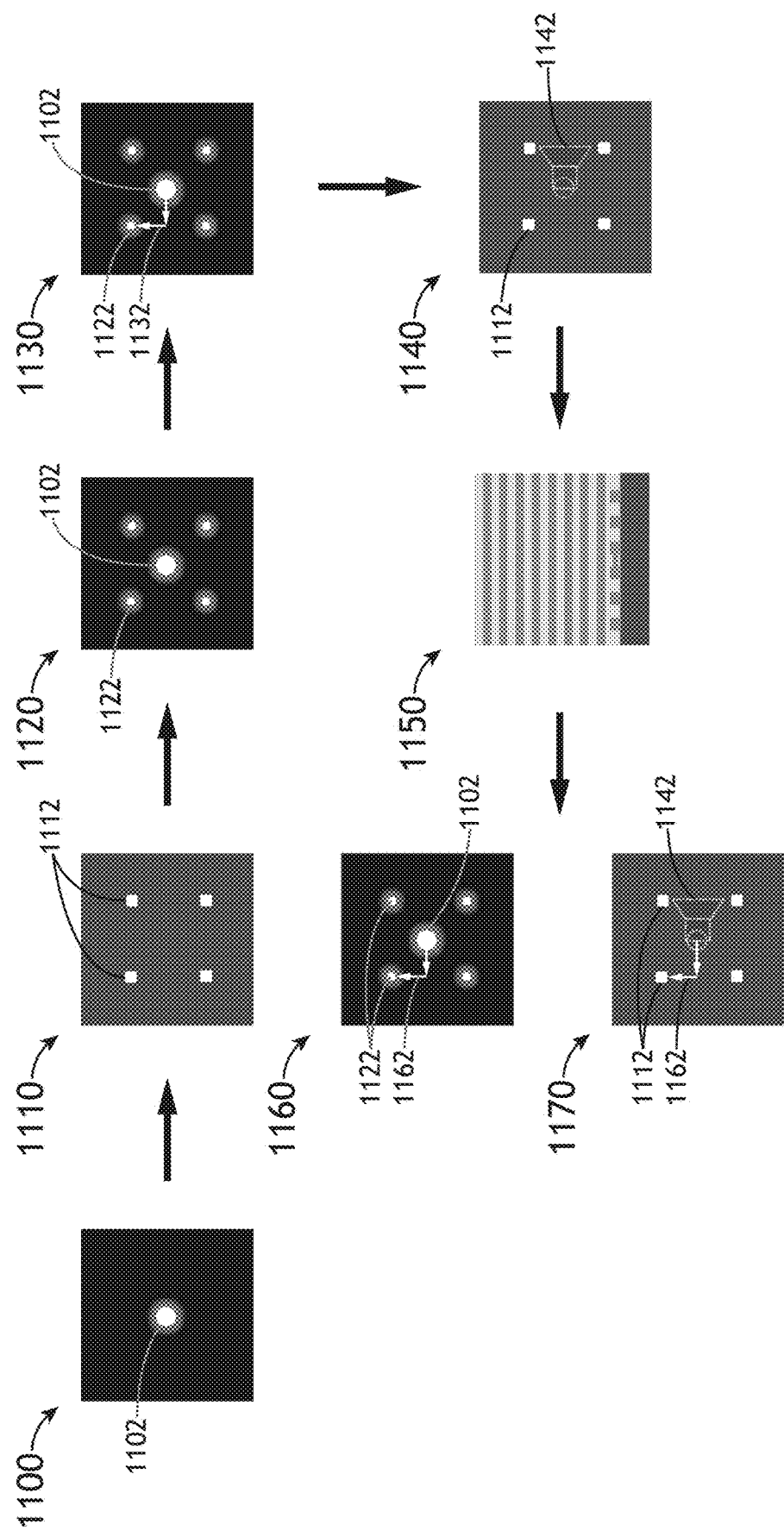
FIG. 11A illustrates a set of conceptual views of a process to determine the accuracy of imaging a defect in a three-dimensional calibration structure via multiple tools, in accordance with one or more embodiments of the present disclosure.
Figure 11B:
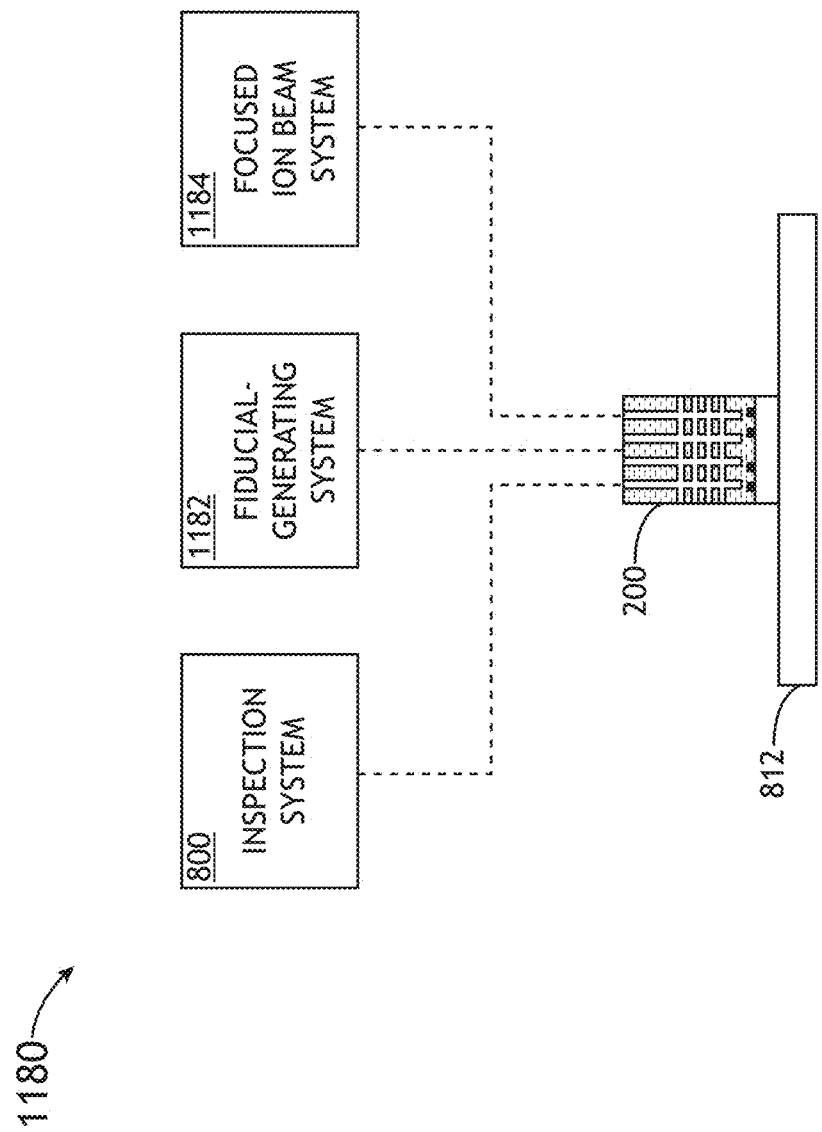
FIG. 11B illustrates a system including multiple tools usable for determining the accuracy of imaging a defect of a three-dimensional calibration structure, in accordance with one or more embodiments of the present disclosure.

In another embodiment, the calibration structure 200 is usable to determine the accuracy of a defect location using multiple tools (e.g., characterization tool including an optical inspection tool or a SEM review tool, focused ion beam (FIB) tool, or the like). FIG. 10 illustrates a process flow diagram depicting a method 1000 to determine an accuracy of imaging a defect in the calibration structure 200 with multiple tools, in accordance with one or more embodiments of the present disclosure. FIG. 11A illustrates a set of conceptual views to determine the accuracy of imaging the defect in the calibration structure 200 with multiple tools via the method 1000, in accordance with one or more embodiments of the present disclosure. FIG. 11B illustrates a system 1180 including multiple tools usable for determining the accuracy of imaging a defect in the calibration structure 200, in accordance with one or more embodiments of the present disclosure.

In step 1002, a defect 1102 is imaged on the calibration structure 200 via a characterization tool, as illustrated in view 1100 of FIG. 11A. In one embodiment, the characterization tool is the characterization tool 800, illustrated as a component of the system 1180 in FIG. 11B.

In step 1004, one or more fiducials 1112 are formed on the surface of the calibration structure 200, as illustrated in view 1110 of FIG. 11A. In one embodiment, the one or more fiducials 1112 are formed via any fiducial-generating tool 1182 known to the semiconductor industry, as illustrated as a component of the system 1180 in FIG. 11B. In another embodiment, the one or more fiducials 1112 are formed via any process known to the semiconductor industry. For example, the process may include, but is not limited to, mechanical nano-indentation, laser ablation, or the like. Utilizing fiducials during calibration of a characterization (e.g., inspection) tool is generally described in U.S. patent application Ser. No. 15/430,817, filed on Feb. 13, 2017, which is incorporated herein in its entirety. The depositing of fiducials via an SEM review tool is generally described in U.S. Pat. No. 9,318,395, issued on Apr. 19, 2016, which is incorporated herein by reference in the entirety. The depositing of fiducials via mechanical nano-indentation is generally described in W. C. Oliver and G. M. Pharr, *An improved technique for determining hardness and elastic using load and displacement sensing indentation experiments*, J. Materials Research, vol. 7, no. 6, pp. 1564-83, (June 1992), which is incorporated herein by reference in the entirety. The depositing of fiducials via laser ablation is generally described in U.S. Pat. No. 5,173,441, issued on Dec. 22, 1992, which is incorporated herein by reference in the entirety.

In step 1006, one or more optical responses 1122 to the one or more fiducials 1112 are measured, as illustrated in view 1120 of FIG. 11A. In one embodiment, the one or more optical responses 1122 are measured via the characterization tool 800, illustrated as a component of the system 1180 in FIG. 11B. For example, the measurement may consist of a composite of two or more intermediate measurements. For instance, the composite may be formed by adding, subtracting, dividing and multiplying different images or applying different 2D image transforms (e.g. Fourier, Hartley, low-pass filter, high-pass filter, smoothing, sharpening, edge-enhancement, matched filter) or 3D image transformations (wavelet, affine) or other general transformations.

In step 1008, one or more offset values 1132 are determined for the one or more measured one or more optical responses 1122 relative to a reference point, as illustrated in view 1130 of FIG. 11A. For example, the one or more offset coordinate values 1132 may be an offset between the one or more optical responses 1122 and the defect 1102. By way of another example, the one or more offset values may include an x-coordinate value and/or a y-coordinate value. For instance, the offset calculation may include collecting SEM images or focused ion microscopy (FIM) images and correlating the data with optical responses to calibrate the optical system.

In step 1010, the calibration structure 200 may be cut at one or more spots 1142 to the known depth at a selected distance from the one or more fiducials 1112, as illustrated in view 1140 of FIG. 11A. In one embodiment, the one or more spots 1142 are cut via a focused ion beam (FIB) tool 1184, illustrated as a component of the system 1180 in FIG. 11B. In another embodiment, the one or more spots 1142 are cut within the uncertainty range of the FIB tool 1184. In another embodiment, the cuts include an x-coordinate, a y-coordinate, and/or a z-coordinate value.

In step 1012, the actual location of the defect is determined via review of a cross-section image 1150 of the calibration structure 200, as illustrated in FIG. 11A. In one embodiment, the cross-section image 1150 is received prior to review.

In step 1014, an offset error 1162 is determined in one or more directions along one or more axes between the one or more measured responses and the determined actual location, as illustrated in FIG. 11A. For example, the offset error 1162 may include an x-coordinate value and/or a y-coordinate value for the one or more optical responses 1122 from the defect location 1102. It is noted herein the x-coordinate value and/or the y-coordinate value of the offset error 1162 may be substantially similar to or different from the x-coordinate value and/or the y-coordinate value of the one or more offset values 1132. By way of another example, the offset error 1162 may be determined for a z-coordinate value. It is noted herein the z-coordinate value for the offset error 1162 may be substantially similar to or different from the z-coordinate value for the one or more spots 1142.

It is noted herein the measurements 1132, 1144, 1162, 1172, 1174 may be replaced with electrical measurements capable of detecting the buried defect. Therefore, the above description should not be interpreted as a limitation on the scope of the present disclosure but merely an illustration.

In another embodiment, the calibration structure 200 is usable to perform standardized characterization tool tests. For example, the standardized characterization tool tests may include, but are not limited to, repeatability measurements performed with the characterization tool successively loaded and unloaded; repeatability measurements performed with repeated reimaging via the characterization tool; measuring the consistency of stepping across different focal planes; characterizing aberrations to determine whether applicability is sufficient; testing the chuck vacuum strength to ensure the wafer is held in place; validating the algorithms selected for detecting buried defects; validating algorithms to ensure the correct focal planes are used (e.g., an autofocus function); determining image sharpness with or without a three-dimensional DSW stack (e.g., the calibration structure 200); determining the minimum defect size that may be detected either with or without a three-dimensional DSW stack (e.g., the calibration structure 200); measuring additional noise caused by an added three-dimensional DSW stack (e.g., the calibration structure 200); measuring the ability to repeatedly detect select defects; measuring the algorithms for testing for variations in wafer processes; measuring the wavelength dependence through a three-dimensional DSW stack (e.g., the calibration structure 200); or the like.

Figure 12:
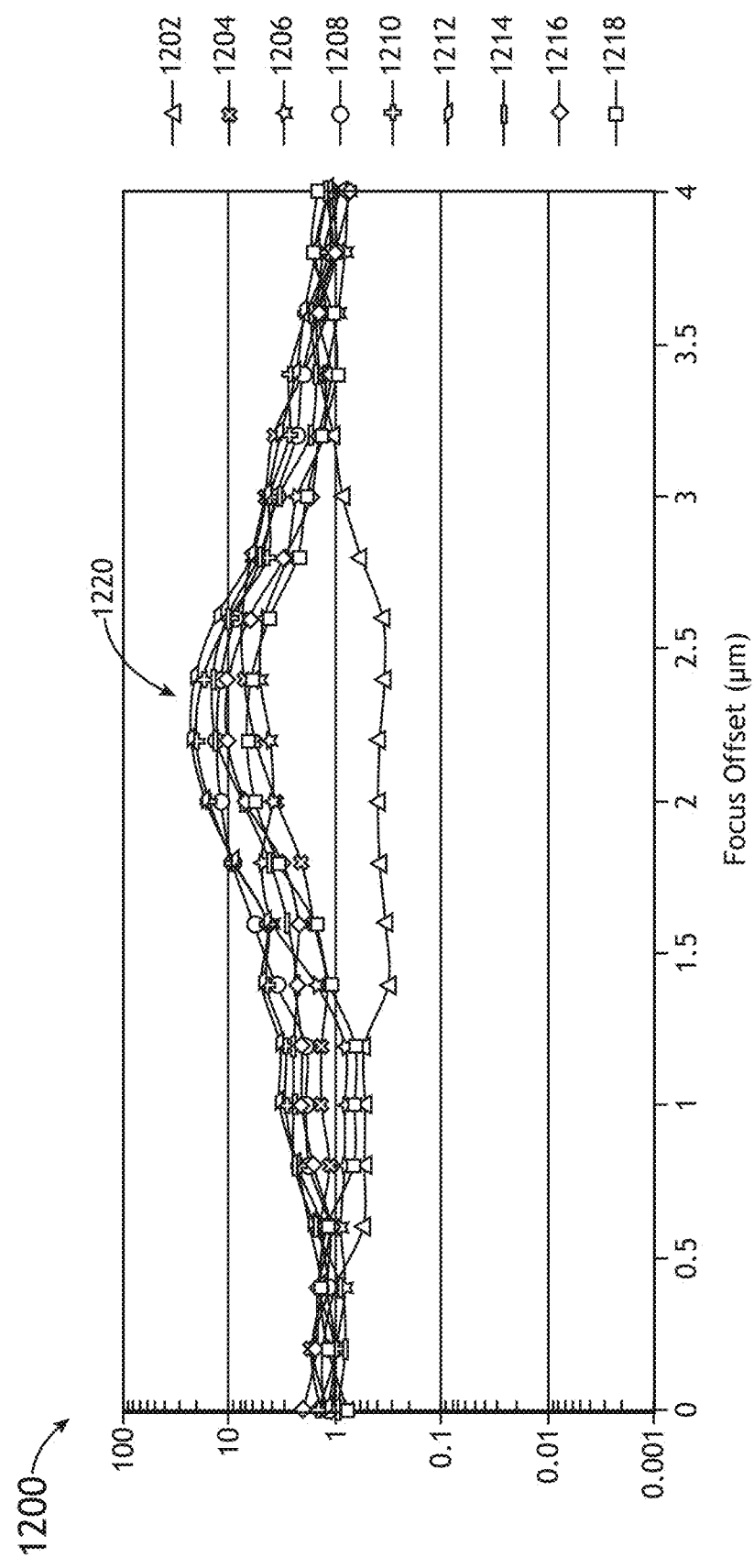
FIG. 12 illustrates a graph of a simulated focus offset for a set of maximum wavelength signals of a tool including a three-dimensional calibration structure for measuring buried defects on a three-dimensional semiconductor device, in accordance with one or more embodiments of the present disclosure.

By way of another example, the standardized characterization tool tests may include measuring the focus offset caused by a select wavelength passed through a three-dimensional DSW stack (e.g., the calibration structure 200). FIG. 12 illustrates a graph 1200 of a simulated focus offset for a set of maximum wavelength signals of a characterization tool 800 including a coated vertical NAND (VNAND) calibration structure with a DSW line-space bridge defect, in accordance with one or more embodiments of the present disclosure. In one embodiment, the characterization tool 800 is a brightfield inspection tool. In another embodiment, wavelengths 1202, 1204, 1206, 1208, 1210, 1212, 1214, 1216, 1218 range from 200 nm to 500 nm. For example, wavelength 1202 is 230 nm; wavelength 1204 is 248 nm; wavelength 1206 is 266 nm; wavelength 1208 is 284 nm; wavelength 1210 is 313 nm; wavelength 1212 is 335 nm; wavelength 1214 is 365 nm; wavelength 1216 is 404 nm; and wavelength 1218 is 436 nm. In another embodiment, the maximum brightfield signal of the wavelengths 1202, 1204, 1206, 1208, 1210, 1212, 1214, 1216, 1218 peaks at a focus offset value 1220 of approximately 2.3 μm. In another embodiment, the measured focus offset caused by a select wavelength passed through a three-dimensional DSW stack (e.g., the calibration structure 200) may be improved upon based on the simulated prediction focus offset in the graph 1200.

Figure 13:
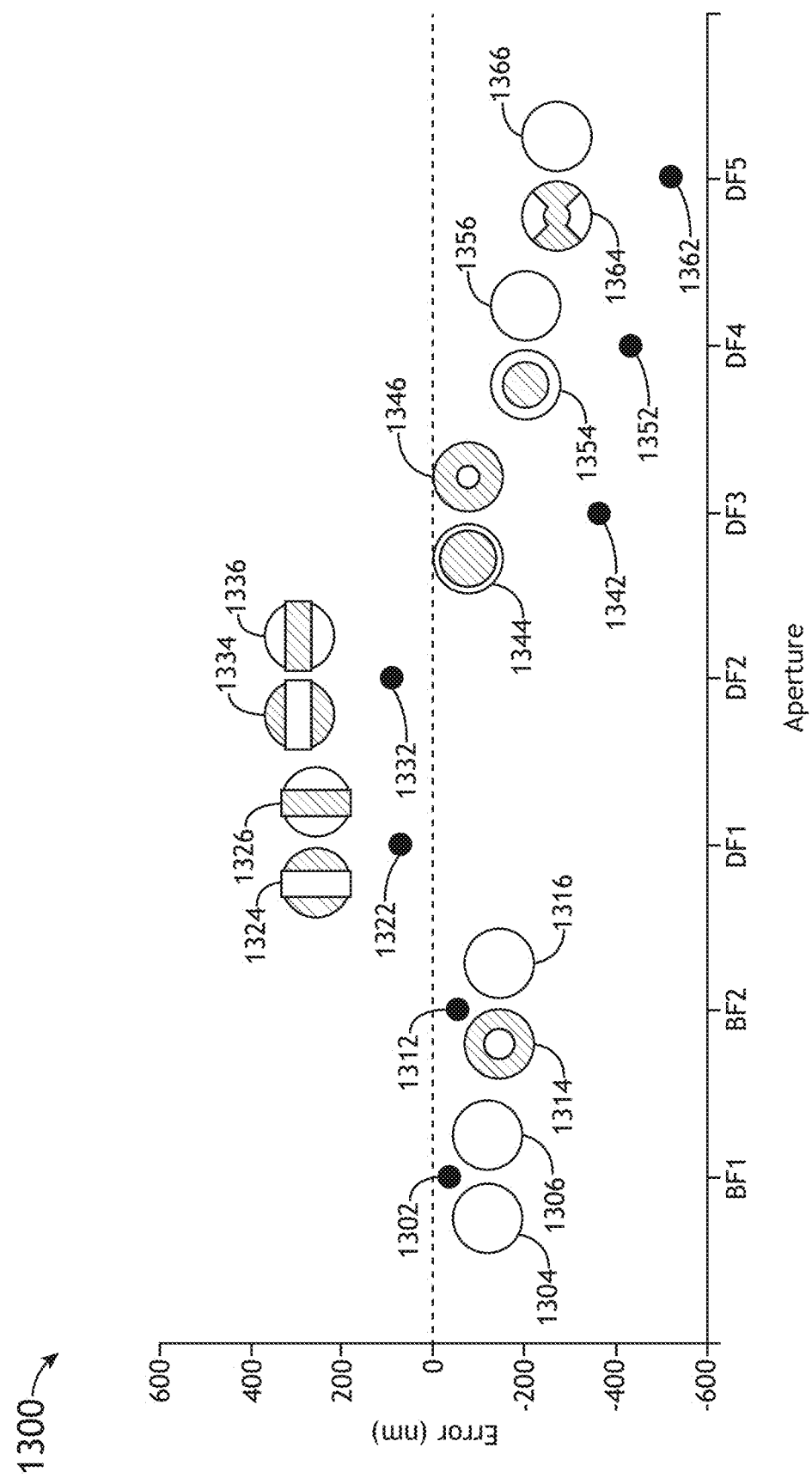
FIG. 13 illustrates a graph comparing focus error offset for inspection characterization tools with select apertures, in accordance with one or more embodiments of the present disclosure.

By way of another example, the standardized characterization tool tests may include measuring the dependence of the depth measurement of a buried defect in a three-dimensional DSW (e.g., the calibration structure 200) on different apertures. FIG. 13 illustrates a graph 1300 comparing depth offset error versus aperture type of select characterization tools, in accordance with one or more embodiments of the present disclosure. In one embodiment, a brightfield (BF) inspection tool with an illumination aperture 1304 and a collection aperture 1306 has an error offset 1302. For example, the error offset 1302 may be approximately 30 nm. In another embodiment, a reduced NA brightfield (BF2) inspection tool with an illumination aperture 1314 and a collection aperture 1316 has an error offset 1312. In another embodiment, a darkfield (DF1) inspection tool with an illumination aperture 1324 and a collection aperture 1326 has an error offset 1322. In another embodiment, a darkfield (DF2) inspection tool with an illumination aperture 1334 and a collection aperture 1336 has an error offset 1332. In another embodiment, a darkfield (DF3) inspection tool with an illumination aperture 1344 and a collection aperture 1346 has an error offset 1342. In another embodiment, a darkfield (DF4) inspection tool with an illumination aperture 1354 and a collection aperture 1356 has an error offset 1352. In another embodiment, a darkfield (DF5) inspection tool with an illumination aperture 1364 and a collection aperture 1366 has an error offset 1362

Figure 14:
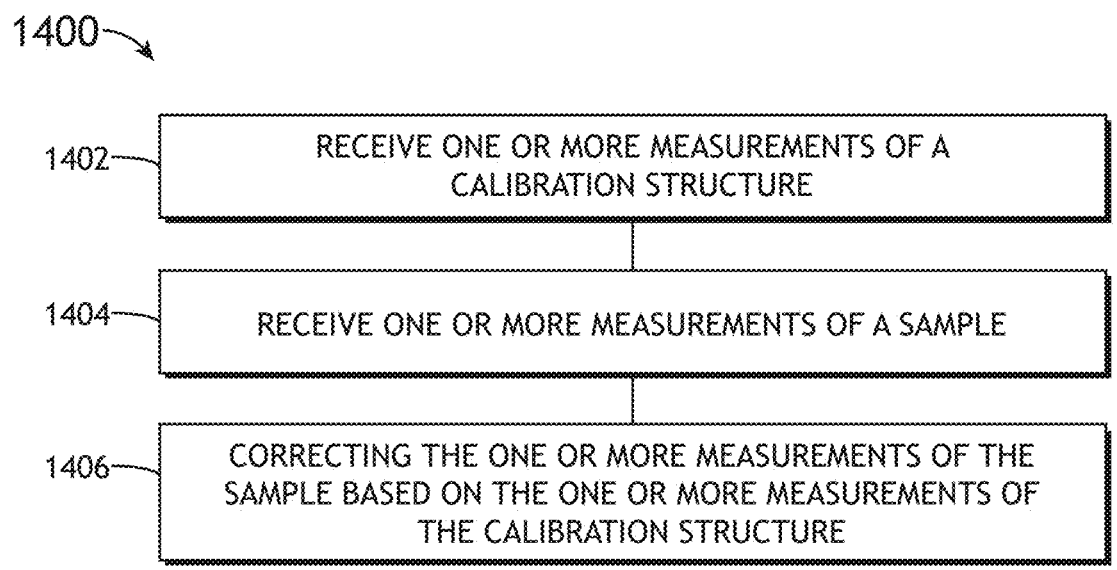
FIG. 14 illustrates a process flow diagram depicting a process to adjust a set of sample measurements based on a set of three-dimensional calibration structure measurements, in accordance with one or more embodiments of the present disclosure.

FIG. 14 illustrates a process flow diagram 1400 depicting a process to adjust a set of sample measurements based on a set of calibration structure measurements, in accordance with one or more embodiments of the present disclosure.

In step 1402, one or more measurements of the calibration structure 200 are received. In one embodiment, the one or more measurements of the calibration structure 200 are acquired via a characterization tool (e.g., the characterization tool 800, or the like).

In step 1404, one or more measurements of a sample are received. In one embodiment, the one or more measurements of the sample are acquired via a characterization tool (e.g., the characterization tool 800, or the like). It is noted herein the characterization tool to acquire the one or more measurements of the sample may be the same as the characterization tool used to acquire the one or more measurements of the calibration structure 200. In this regard, the calibration structure 200 serves to calibrate the characterization tool prior to the acquiring of the one or more measurements of the sample. It is noted herein, however, that the characterization tool to acquire the one or more measurements of the sample may be different from the characterization tool used to acquire the one or more measurements of the calibration structure 200. Therefore, the above description should not be interpreted as a limitation on the scope of the present disclosure but merely an illustration.

In step 1406, the received one or more measurements of the sample are corrected based on the received one or more measurements of the calibration structure 200. In one embodiment, the received one or more measurements of the calibration structure 200 and the received one or more measurements of the sample are compared. For example, comparing the received one or more measurements of the calibration structure 200 and the received one or more measurements of the sample may include determining one or more offset errors in the one or more measurements of the calibration structure 200. For instance, the one or more offset errors may be determined via the method 1000. Additionally, the one or more offset errors may be determined via a process implementing EQ. 1. Further, the one or more offset errors may be determined via any of the standardized characterization tool tests as previously described herein. In another embodiment, the one or more measurements of the sample are adjusted. For example, the one or more measurements of the sample may be adjusted to include and/or compensate for an offset error determined following the comparing of the received one or more measurements of the calibration structure 200 and the received one or more measurements of the sample. By way of another example, one or more operational parameters of the characterization tool (e.g., the characterization tool 800, or the like) may be adjusted following the comparing of the received one or more measurements of the calibration structure 200 and the received one or more measurements of the sample. For instance, the one or more operational parameters of the characterization tool may be adjusted via a feed forward loop and/or a feedback loop.

Advantages of the present disclosure include a calibration structure for measuring a three-dimensional DSW calibration structure including programmed buried defects to calibrate, demonstrate, and/or establish baselines for buried defect detection or characterization of three-dimensional semiconductor devices (e.g., 3D NAND semiconductor devices). Advantages of the present disclosure additionally include a method of fabricating the three-dimensional DSW calibration structure including programmed buried defects to calibrate, demonstrate, and/or establish baselines for buried defect detection or characterization of three-dimensional semiconductor devices. Advantages of the present disclosure additionally include a system for fabricating the three-dimensional DSW calibration structure including programmed buried defects to calibrate, demonstrate, and/or establish baselines for buried defect detection or characterization of three-dimensional semiconductor devices.

Advantages of the present disclosure additionally include a method for calibrating a characterization tool with the three-dimensional DSW calibration structure including programmed buried defects to calibrate, demonstrate, and/or establish baselines for buried defect detection or characterization of three-dimensional semiconductor devices. Advantages of the present disclosure additionally include a system for calibrating the characterization tool with the three-dimensional DSW calibration structure including programmed buried defects to calibrate, demonstrate, and/or establish baselines for buried defect detection or characterization of three-dimensional semiconductor devices.

It is noted herein that a three-dimensional DSW calibration structure which provides defects in a similar condition to a 3D NAND semiconductor device is more applicable in the semiconductor industry than a 2D DSW calibration structure. For example, the three-dimensional DSW calibration structure may provide a representation of interference effects, additional wafer noise, stress deformation, thickness variance, or the like as caused by the additional of multiple layers. By way of another example, a three-dimensional DSW calibration structure including programmed buried defects (e.g., periodic holes, lines, and/or patterned structures) may provide a means to test semiconductor device dependencies including, but not limited to, dependencies to wavelength, angular orientation, position, aperture type, or the like, in contrast to a two-dimensional DSW calibration structure.

By way of another example, a three-dimensional DSW calibration structure that provides defects in a similar condition to 3D NAND semiconductor device may reduce errors in calibration and/or baseline measurements caused by non-compliance with process-specifics and/or uncertainties due to lack of information (either actual or artificial caused by IP concerns). For instance, the lacking information may include, but is not limited to, exact refractive indexes of all materials, thicknesses of the thin films, dimension of the structures, locations of defects a priori, defect type a priori, defect dimension a priori, defect material a priori, or the like. In this regard, having all parameters of the three-dimensional DSW calibration structure known, controlled, and/or consistent allows for the performing of standardized tests.

Although embodiments of the present disclosure are directed to performing characterization on a three-dimensional DSW (e.g., the calibration structure 200), it is noted herein that characterization may be performed on a 2D DSW using the systems and methods provided herein. Therefore, the above description should not be interpreted as a limitation on the scope of the present disclosure but merely an illustration.

One skilled in the art will recognize that the herein described components (e.g., operations), devices, objects, and the discussion accompanying them are used as examples for the sake of conceptual clarity and that various configuration modifications are contemplated. Consequently, as used herein, the specific exemplars set forth and the accompanying discussion are intended to be representative of their more general classes. In general, use of any specific exemplar is intended to be representative of its class, and the non-inclusion of specific components (e.g., operations), devices, and objects should not be taken limiting.

With respect to the use of substantially any plural and/or singular terms herein, those having skill in the art can translate from the plural to the singular and/or from the singular to the plural as is appropriate to the context and/or application. The various singular/plural permutations are not expressly set forth herein for sake of clarity.

The herein described subject matter sometimes illustrates different components contained within, or connected with, different other components. It is to be understood that such depicted architectures are merely exemplary, and that in fact many other architectures may be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality, and any two components capable of being so associated can also be viewed as being "operably couplable," to each other to achieve the desired functionality. Specific examples of operably couplable include but are not limited to physically mateable and/or physically interacting components, and/or wirelessly interactable, and/or wirelessly interacting components, and/or logically interacting, and/or logically interactable components.

In some instances, one or more components may be referred to herein as "configured to," "configurable to," "operable/operative to," "adapted/adaptable," "able to," "conformable/conformed to," etc. Those skilled in the art will recognize that such terms (e.g., "configured to") can generally encompass active-state components and/or inactive-state components and/or standby-state components, unless context requires otherwise.

While particular aspects of the present subject matter described herein have been shown and described, it will be apparent to those skilled in the art that, based upon the teachings herein, changes and modifications may be made without departing from the subject matter described herein and its broader aspects and, therefore, the appended claims are to encompass within their scope all such changes and modifications as are within the true spirit and scope of the subject matter described herein. It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to claims containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that typically a disjunctive word and/or phrase presenting two or more alternative terms, whether in the description, claims, or drawings, should be understood to contemplate the possibilities of including one of the terms, either of the terms, or both terms unless context dictates otherwise. For example, the phrase "A or B" will be typically understood to include the possibilities of "A" or "B" or "A and B."

With respect to the appended claims, those skilled in the art will appreciate that recited operations therein may generally be performed in any order. Also, although various operational flows are presented in a sequence(s), it should be understood that the various operations may be performed in other orders than those which are illustrated, or may be performed concurrently. Examples of such alternate orderings may include overlapping, interleaved, interrupted, reordered, incremental, preparatory, supplemental, simultaneous, reverse, or other variant orderings, unless context dictates otherwise. Furthermore, terms like "responsive to," "related to," or other past-tense adjectives are generally not intended to exclude such variants, unless context dictates otherwise.

Although particular embodiments of this invention have been illustrated, it is apparent that various modifications and embodiments of the invention may be made by those skilled in the art without departing from the scope and spirit of the foregoing disclosure. It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes. Accordingly, the scope of the invention should be limited only by the claims appended hereto.

What is claimed:

1. A system, comprising:
a controller, wherein the controller includes one or more processors configured to receive one or more measurements from a characterization tool, wherein the controller includes memory configured to store a set of program instructions, wherein the one or more processors are configured to execute the set of program instructions, wherein the set of program instructions are configured to cause the one or more processors to:
receive, from the characterization tool, one or more measurements of a three-dimensional defect standard wafer containing one or more buried defects;
receive, from the characterization tool, one or more measurements of the sample; and
correct the received one or more measurements of the sample based on the received one or more measurements of the three-dimensional defect standard wafer containing one or more buried defects.

2. The system in claim 1, wherein the three-dimensional defect standard wafer comprises:
a wafer including one or more programmed surface defects disposed on the surface of the wafer;
a planarized layer deposited on the wafer;
a layer stack deposited on the planarized layer, wherein the layer stack includes two or more alternating layers;
a cap layer deposited on the layer stack, wherein one or more air gaps are formed in the layer stack following deposition of the cap layer; and
one or more holes patterned and etched into at least one of the cap layer, the layer stack, or the planarized layer.

3. The system in claim 2, wherein at least one of the cap layer, the layer stack, or the planarized layer are patterned and etched to form the one or more holes.

4. The system in claim 2, wherein the layer stack is patterned and etched to form the one or more air gaps.

5. The system in claim 4, wherein the one or more air gaps are formed by patterning and etching into the layer stack at an orientation substantially perpendicular to an orientation of the one or more holes.

6. The system in claim 1, wherein the characterization tool comprises an inspection tool.

7. The system in claim 1, wherein the characterization tool comprises a review tool.

8. The system in claim 1, wherein the characterization tool comprises:
an illumination source configured to generate a first beam of illumination;
a set of focusing optics configured to direct the first beam of illumination onto a surface of the three-dimensional defect standard wafer;
at least one detector configured to detect a second beam of illumination reflected or scattered from the surface of the three-dimensional defect standard wafer in response to at least a portion of the first beam of illumination;
a set of collection optics configured to direct the second beam of illumination reflected or scattered from the surface of the three-dimensional defect standard wafer to the at least one detector; and
a stage for securing at least one of the three-dimensional defect standard wafer or the sample.

9. The system in claim 8, wherein the at least one detector of the characterization tool images a programmed defect in the three-dimensional defect standard wafer.

10. The system in claim 9, further comprising:
a fiducial-generating tool, wherein the fiducial-generating tool deposits one or more fiducials on the three-dimensional defect standard wafer.

11. The system in claim 10, wherein the one or more fiducials are deposited on the three-dimensional defect standard wafer in a selected pattern.

12. The system in claim 10, wherein the at least one detector of the characterization tool measures one or more responses to the one or more fiducials.

13. The system in claim 12, wherein the set of program instructions are further configured to cause the one or more processors to:
receive the one or more measured responses to the one or more fiducials; and
determine an offset error in one or more directions along one or more axes for the one or more measured responses relative to a reference point.

14. The system in claim 13, further comprising
a focused-ion beam tool, wherein the focused-ion beam tool cuts the three-dimensional defect standard wafer to a known depth corresponding to a position of the programmed defect.

15. The system in claim 14, wherein the set of program instructions are further configured to cause the one or more processors to:
receive a cross-section image of the three-dimensional defect standard wafer; and
determine the actual location of the programmed defect from the cross-section image of the three-dimensional defect standard wafer.

16. The system in claim 15, wherein the set of program instructions are further configured to cause the one or more processors to:
receive the actual location of the programmed defect determined from the cross-section image of the three-dimensional defect standard wafer; and
determine an offset error in one or more directions along one or more axes between the one or more measured responses and the determined actual location.

17. A system, comprising:
a characterization tool configured to:
acquire one or more measurements of a three-dimensional defect standard wafer contained one or more buried defects; and
acquire one or more measurements of a sample; and
a controller, wherein the controller includes one or more processors configured to receive one or more measurements from the characterization tool, wherein the controller includes memory configured to store a set of program instructions, wherein the one or more processors are configured to execute the set of program instructions, wherein the set of program instructions are configured to cause the one or more processors to:
receive the one or more measurements of the three-dimensional defect standard wafer containing one or more buried defects;
receive the one or more measurements of the sample; and
correct the received one or more measurements of the sample based on the received one or more measurements of the three-dimensional defect standard wafer containing one or more buried defects.

18. The system in claim 17, wherein the three-dimensional defect standard wafer comprises:
a wafer including one or more programmed surface defects disposed on the surface of the wafer;
a planarized layer deposited on the DSW;
a layer stack deposited on the planarized layer, wherein the layer stack includes two or more alternating layers;
a cap layer deposited on the layer stack, wherein one or more air gaps are formed in the layer stack following deposition of the cap layer; and
one or more holes patterned and etched into at least one of the cap layer, the layer stack, or the planarized layer.

19. A method, comprising:
receiving one or more measurements of a three-dimensional defect standard wafer containing one or more buried defects from a characterization tool, the three-dimensional defect standard wafer comprising:
a wafer including one or more programmed surface defects;
a planarized layer deposited on the wafer;

a layer stack deposited on the planarized layer, wherein the layer stack includes two or more alternating layers;

a cap layer deposited on the layer stack, wherein one or more air gaps are formed in the layer stack following deposition of the cap layer; and one or more holes patterned and etched into at least one of the cap layer, the layer stack, or the planarized layer;

receiving one or more measurements of a sample from the characterization tool; and correcting the received one or more measurements of the sample based on the received one or more measurements of the three-dimensional defect standard wafer.

20. The method in claim 19, wherein at least one of the cap layer, the layer stack, or the planarized layer are patterned and etched to form the one or more holes.

21. The method in claim 19, wherein the layer stack is patterned and etched to form the one or more air gaps.

22. The method in claim 21, wherein the one or more air gaps are formed by patterning and etching into the layer stack at an orientation substantially perpendicular to an orientation of the one or more holes.

23. The method in claim 19, wherein the one or more measurements of the three-dimensional defect standard wafer are acquired by a characterization tool, wherein the one or more measurements of the sample are acquired by the characterization tool.

24. The method in claim 23, further comprising:
imaging a programmed defect in the three-dimensional defect standard wafer via the characterization tool.

25. The method in claim 24, further comprising:
depositing one or more fiducials on the three-dimensional defect standard wafer in a pattern via a fiducial-generating tool.

26. The method in claim 25, further comprising:
measuring one or more responses to the one or more fiducials.

27. The method in claim 26, further comprising:
determining an offset error in one or more directions along one or more axes for the one or more measured responses relative to a reference point.

28. The method in claim 27, further comprising:
cutting to a known depth corresponding to a position of the programmed defect via a focused ion beam tool.

29. The method in claim 28, further comprising:
determining a location of the programmed defect via a cross-section image of the three-dimensional defect standard wafer.

30. The method in claim 29, further comprising:
determining an offset error in one or more directions along one or more axes between the one or more measured responses and the determined actual location.

* * * * *